United States Patent
Kato

(10) Patent No.: US 10,074,663 B2
(45) Date of Patent: *Sep. 11, 2018

(54) SEMICONDUCTOR DEVICE

(71) Applicant: Semiconductor Energy Laboratory Co., Ltd., Atsugi-shi, Kanagawa-ken (JP)

(72) Inventor: Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 23 days.

This patent is subject to a terminal disclaimer.

(21) Appl. No.: 15/278,546

(22) Filed: Sep. 28, 2016

(65) Prior Publication Data

US 2017/0018560 A1    Jan. 19, 2017

Related U.S. Application Data

(63) Continuation of application No. 13/117,592, filed on May 27, 2011, now Pat. No. 9,064,884, and a
(Continued)

(30) Foreign Application Priority Data

Jun. 4, 2010   (JP) ................. 2010-129320

(51) Int. Cl.
*H01L 21/336* (2006.01)
*H01L 27/11551* (2017.01)
(Continued)

(52) U.S. Cl.
CPC .... *H01L 27/11551* (2013.01); *G11C 16/0466* (2013.01); *H01L 27/0688* (2013.01);
(Continued)

(58) Field of Classification Search
None
See application file for complete search history.

(56) References Cited

U.S. PATENT DOCUMENTS 5,712,817 A   1/1998   Suh
5,731,856 A   3/1998   Kim et al.
(Continued)

FOREIGN PATENT DOCUMENTS

EP   1737044 A   12/2006
EP   2226847 A   9/2010
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A. No. 2, pp. 115-116.
(Continued)

*Primary Examiner* — Dung Le
(74) *Attorney, Agent, or Firm* — Robinson Intellectual Property Law Office; Eric J. Robinson

(57) ABSTRACT

An object is to provide a semiconductor device having a novel structure with a high degree of integration. A semiconductor device includes a semiconductor layer having a channel formation region, a source electrode and a drain electrode electrically connected to the channel formation region, a gate electrode overlapping with the channel formation region, and a gate insulating layer between the channel formation region and the gate electrode. A portion of a side surface of the semiconductor layer having the channel formation region and a portion of a side surface of the source electrode or the drain electrode are substantially aligned with each other when seen from a planar direction.

19 Claims, 11 Drawing Sheets

Related U.S. Application Data continuation of application No. 14/703,384, filed on May 4, 2015, now Pat. No. 9,461,067.

(51) Int. Cl.

| | | |
|---|---|---|
| *G11C 16/04* | (2006.01) | |
| *H01L 27/06* | (2006.01) | |
| *H01L 27/11521* | (2017.01) | |
| *H01L 27/1156* | (2017.01) | |
| *H01L 27/12* | (2006.01) | |
| *H01L 49/02* | (2006.01) | |
| *H01L 29/04* | (2006.01) | |
| *H01L 29/16* | (2006.01) | |
| *H01L 29/24* | (2006.01) | |
| *H01L 29/78* | (2006.01) | |
| *H01L 29/786* | (2006.01) | |

(52) U.S. Cl.
CPC .... *H01L 27/1156* (2013.01); *H01L 27/11521* (2013.01); *H01L 27/1207* (2013.01); *H01L 27/1225* (2013.01); *H01L 28/60* (2013.01); *H01L 29/04* (2013.01); *H01L 29/16* (2013.01); *H01L 29/24* (2013.01); *H01L 29/78* (2013.01); *H01L 29/7869* (2013.01)

(56) References Cited

U.S. PATENT DOCUMENTS

| | | | |
|---|---|---|---|
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,129,538 B2 | 10/2006 | Lee et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,573,083 B2 | 8/2009 | Kijima et al. | |
| 7,674,650 B2 | 3/2010 | Akimoto et al. | |
| 7,732,819 B2 | 6/2010 | Akimoto et al. | |
| 7,755,126 B2 | 7/2010 | Kondo | |
| 7,825,455 B2 | 11/2010 | Lee et al. | |
| 8,530,246 B2 | 9/2013 | Ofuji et al. | |
| 9,064,884 B2 | 6/2015 | Kato | |
| 9,461,067 B2 * | 10/2016 | Kato | G11C 16/0466 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0230734 A1 | 10/2005 | Ha et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0050884 A1 | 2/2009 | Ye | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142888 A1 | 6/2009 | Tsuchiya | |
| 2009/0152506 A1 | 6/2009 | Umeda et al. | |
| 2009/0152541 A1 | 6/2009 | Maekawa et al. | |
| 2009/0224245 A1 | 9/2009 | Umezaki | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |

FOREIGN PATENT DOCUMENTS

| | | |
|---|---|---|
| JP | 57-105889 A | 7/1982 |
| JP | 60-198861 A | 10/1985 |
| JP | 61-182266 A | 8/1986 |
| JP | 63-070558 A | 3/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-118964 A | 4/1992 |
| JP | 05-251705 A | 9/1993 |
| JP | 08-017948 A | 1/1996 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-311317 A | 11/2005 |
| JP | 2006-005115 A | 1/2006 |
| JP | 2007-157982 A | 6/2007 |
| JP | 2009-016368 A | 1/2009 |
| JP | 2009-277702 A | 11/2009 |
| WO | WO-2004/114391 | 12/2004 |
| WO | WO-2009/139482 | 11/2009 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3-A2O3-BO SYSTEMS [A; Fe, Ga, or Al; B: Mg, Mn, Fe, Ni, Cu,or Zn] at Temperatures Over 1000° C", Journal of Solid State Chemistry. 1985, vol. 60, pp. 382-384.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1. pp. 170-178.

Chern.H et al., "An Analytical Model for the Above-Threshold Characteristics of Polyselicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies far Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et at., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al,, "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Invitation to pay additional fees (application No. PCT/JP2011/061916) , International Searching Authority, dated Jun. 28, 2011.
Kim.W et al., "An Experimental High-Density DRAM Cell with a Built-in Gain Stage", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ", IEDM 92: Technical Digest of International Electron Devices Meeting, Dec. 13, 1992, pp. 1006-1008.
Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.
Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

\* cited by examiner

SEMICONDUCTOR DEVICE

TECHNICAL FIELD

An embodiment of the invention disclosed herein relates to a semiconductor device including a semiconductor element and a manufacturing method of the semiconductor device.

BACKGROUND ART

Memory devices including semiconductor elements are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a memory element is selected and electric charge is stored in a capacitor.

When data is read from a DRAM, electric charge in a capacitor is lost according to the above-described principle; thus, another writing operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or removing the charge, and a circuit for that purpose is required. Further, it takes a relatively long time to inject or remove electric charge, and it is not easy to increase the speed of writing or erasing data.

REFERENCE

[Patent Document 1] Japanese Published Patent Application No. S57-105889

DISCLOSURE OF INVENTION

For memory devices (also simply referred to as semiconductor devices) including semiconductor elements as described above, a sufficient reduction in size is required in terms of an increase in storage capacity, a reduction in product unit price, or the like. In addition, memory devices including semiconductor elements as described above do not have satisfactory functions that meet a variety of requirements, and therefore need to have further improved functions.

In view of the above problems, it is an object of one embodiment of the disclosed invention to provide a semiconductor device having a novel structure with a high degree of integration.

It is another object to achieve a high degree of integration of a semiconductor device having a novel structure, which can hold stored data even when not powered and which has an unlimited number of write cycles.

In an embodiment of the disclosed invention, side surfaces (or portions thereof) of components of a transistor included in a semiconductor device are aligned with each other. Transistors are integrated three-dimensionally. Specifically, an example of a structure of a semiconductor device is as follows.

In one embodiment of the disclosed invention, a semiconductor device includes a semiconductor layer having a channel formation region, a source electrode and a drain electrode electrically connected to the channel formation region, a gate electrode overlapping with the channel formation region, and a gate insulating layer between the channel formation region and the gate electrode. A portion of a side surface of the semiconductor layer having the channel formation region and a portion of a side surface of the source electrode or the drain electrode are substantially aligned with each other when seen from a planar direction.

Here, the channel formation region may include an oxide semiconductor. In addition, a material of the channel formation region and a material of the source electrode or the drain electrode may be processable by the same process (such as a dry etching process using the same etching gas). Furthermore, the side surface of the semiconductor layer having the channel formation region may be parallel with a channel length direction.

In another embodiment of the disclosed invention, a semiconductor device includes a first transistor including a first channel formation region, a first gate insulating layer over the first channel formation region, a first gate electrode over the first gate insulating layer, which overlaps with the first channel formation region, and a first source region and a first drain region between which the first channel formation region is sandwiched, and a second transistor including a semiconductor layer having a second channel formation region, a second source electrode and a second drain electrode electrically connected to the second channel formation region, a second gate electrode overlapping with the second channel formation region, and a second gate insulating layer between the second channel formation region and the second gate electrode. The first channel formation region and the second channel formation region include different semiconductor materials as their respective main components. A portion of a side surface of the first channel formation region, a portion of a side surface of the first gate insulating layer, and a portion of a side surface of the first gate electrode are substantially aligned with each other when seen from a planar direction. A portion of a side surface of the semiconductor layer having the second channel formation region and a portion of a side surface of the second source electrode or the second drain electrode are substantially aligned with each other when seen from a planar direction.

Here, the second channel formation region may include an oxide semiconductor. A material of the first channel formation region, a material of the first gate insulating layer, and a material of the first gate electrode may be processable by the same process. The side surface of the first channel formation region may be parallel with a channel length direction of the first transistor. A material of the second channel formation region and a material of the second source electrode or the second drain electrode may be processable by the same process. The side surface of the semiconductor layer having the second channel formation region may be parallel with a channel length direction of the second transistor.

In the above embodiment, the first gate electrode may be electrically connected to the second source electrode or the second drain electrode. The semiconductor device may include a plurality of first transistors and a plurality of second transistors. A first source region or a first drain region of one of the plurality of first transistors may be electrically connected to a first drain region or a first source region of a first transistor adjacent to the one of the plurality of first transistors. A second source electrode or a second drain electrode of one of the plurality of second transistors may be electrically connected to a second drain electrode or a second source electrode of a second transistor adjacent to the one of the plurality of second transistors.

Note that although, in the above embodiments, the transistor may be formed using an oxide semiconductor, the disclosed invention is not limited thereto. A material capable of realizing off-state current characteristics comparable to those of an oxide semiconductor, for example, a widegap material (specifically, a semiconductor material having an energy gap Eg of more than 3 eV, for example), such as silicon carbide, or the like may be employed.

In this specification and the like, the expression "portions of side surfaces are aligned with each other when seen from a planar direction" means that side surfaces of objects overlap each other at least partly when seen from a direction perpendicular to a surface (or a rear surface) of a substrate. In addition, the expression "substantially aligned" does not require exact alignment. For example, the expression "substantially aligned" includes a degree of alignment in a shape obtained by etching a plurality of layers with the same mask. Furthermore, the term "channel length direction" refers to a direction from a source region (or a source electrode) toward a drain region (or a drain electrode), or the opposite direction, along the shortest path between the source region and the drain region.

In addition, the term "main component" used in this specification and the like refers to a component whose content is the highest (at. %). According to this statement, for example, it can be said that the main component of a so-called "silicon wafer" is silicon.

Note that the term such as "over" or "below" in this specification and the like does not necessarily mean that a component is placed "directly on" or "directly under" another component. For example, the expression "a gate electrode over a gate insulating layer" does not exclude the case where a component is placed between the gate insulating layer and the gate electrode.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification and the like.

Note that the term "electrically connected" in this specification and the like includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In a semiconductor device according to an embodiment of the disclosed invention, side surfaces (or portions thereof) of components of a transistor are aligned with each other. Accordingly, an increase in the degree of integration of the semiconductor device can be achieved. In particular, in a structure including three-dimensionally integrated transistors, a more significant effect can be obtained in combination with an increase in the degree of integration owing to this three-dimensional structure.

BEST MODE FOR CARRYING OUT THE INVENTION

Figure 1A:
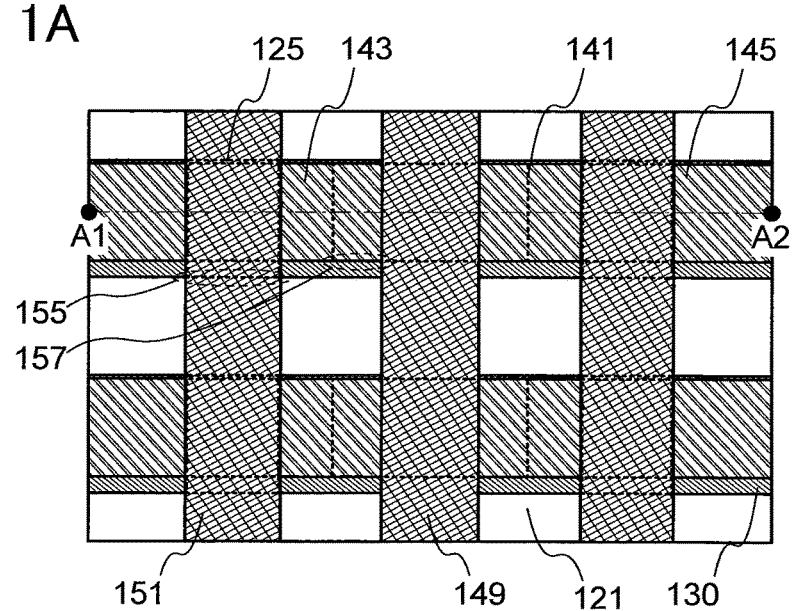
FIGS. 1A and 1B are a plan view and a cross-sectional view of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a structure and a manufacturing method of a semiconductor device according to one embodiment of the disclosed invention will be described with reference to FIGS. 1A and 1B, FIGS. 2A to 2C, FIGS. 3A to 3C, FIGS. 4A to 4C, and FIGS. 5A to 5C. Note that FIGS. 1A and 1B, FIGS. 2A to 2C, FIGS. 3A to 3C, FIGS. 4A to 4C, and FIGS. 5A to 5C illustrate part of the semiconductor device for explanation of the semiconductor device and the manufacturing method thereof and do not illustrate the entire structure of the semiconductor device.

Cross-Sectional Structure and Planar Structure of Semiconductor Device

Figure 1B:
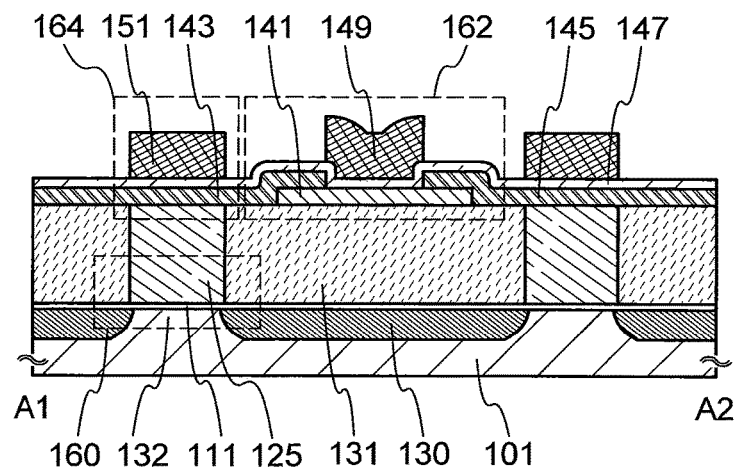

FIGS. 1A and 1B illustrate an example of a structure of the semiconductor device. FIG. 1A is a plan view illustrating part of the semiconductor device, and FIG. 1B is a cross-sectional view taken along line A1-A2 of FIG. 1A. In addition, a cross section taken along line A1-A2 of FIG. 2A corresponds to the cross section shown in FIG. 1B. The same applies to FIGS. 2B and 2C, FIGS. 3A to 3C, FIGS. 4A to 4C, and FIGS. 5A to 5C. The semiconductor device illustrated in FIGS. 1A and 1B includes a transistor 160 including a first semiconductor material in a lower portion, and a transistor 162 including a second semiconductor material and a capacitor 164 in an upper portion.

Here, the first semiconductor material and the second semiconductor material preferably include different semiconductor materials as their respective main components. For example, the first semiconductor material can be a semiconductor material (such as silicon) other than an oxide semiconductor, and the second semiconductor material can be an oxide semiconductor. A transistor including a material other than an oxide semiconductor, such as single crystal silicon, can operate at high speed easily. On the other hand, a transistor including an oxide semiconductor can hold electric charge for a long time owing to its characteristics. Note that the term "main component" used in this specification and the like refers to a component whose content is the highest (at. %). According to this statement, for example, it can be said that the main component of a so-called "silicon wafer" is silicon.

Note that these transistors may be either n-channel transistors or p-channel transistors.

The transistor 160 in FIG. 1B includes a channel formation region 132 provided in a substrate 101 including a semiconductor material (such as silicon), impurity regions 130 provided such that the channel formation region 132 is sandwiched therebetween, a gate insulating layer 111 provided over the channel formation region 132, and a gate electrode 125 provided over the gate insulating layer 111. Here, the impurity regions 130 each function as a source region or a drain region of the transistor. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region and the term "drain electrode" may include a drain region.

Figure 3A:
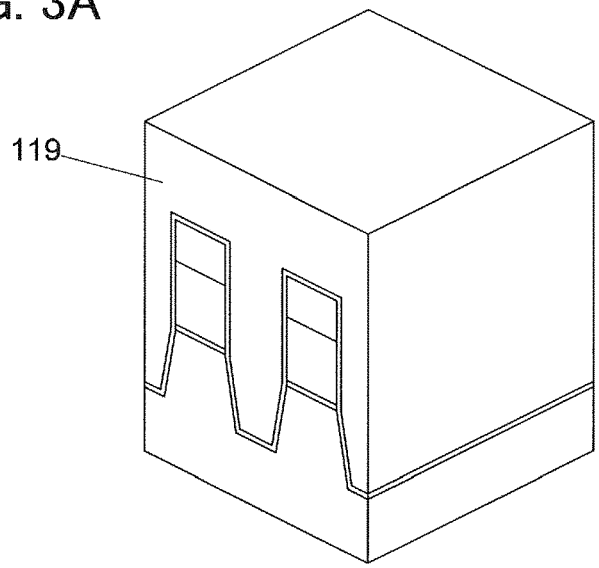
FIGS. 3A to 3C are perspective views illustrating a manufacturing process of a semiconductor device.

When the transistor 160 is seen from a planar direction, portions of side surfaces of the channel formation region 132 provided in the substrate 101, the gate insulating layer 111, and the gate electrode 125 are substantially aligned with each other (see FIG. 1A). In particular, as illustrated in FIG. 3C, side surfaces of the channel formation region 132 provided in the substrate 101, the gate insulating layer 111, and the gate electrode 125 which are parallel with a channel length direction (for example, side surfaces located in a region 155 in FIG. 1A) are substantially aligned with each other. By formation of the transistor 160 in such a planar layout, an increase in the degree of integration of the semiconductor device including the transistor 160 can be achieved. Here, the expression "portions of side surfaces are aligned with each other when seen from a planar direction" means that side surfaces of objects overlap each other at least partly when seen from a direction perpendicular to a surface (or a rear surface) of the substrate 101. In addition, the expression "substantially aligned" does not require exact alignment. For example, the expression "substantially aligned" includes a degree of alignment in a shape obtained by etching a plurality of layers with the same mask. Furthermore, the term "channel length direction" refers to a direction from a source region toward a drain region, or the opposite direction, along the shortest path between the source region and the drain region.

Figure 3B:
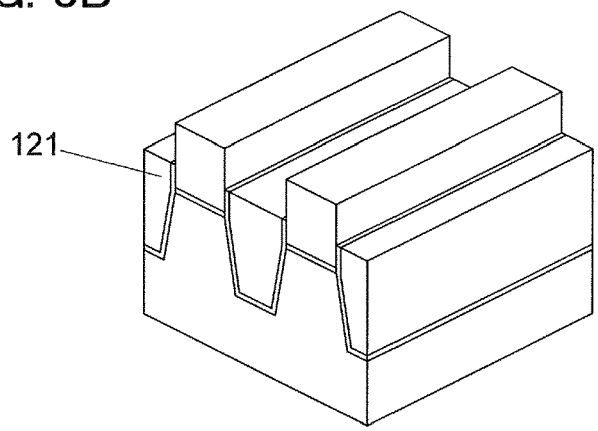
Figure 3C:
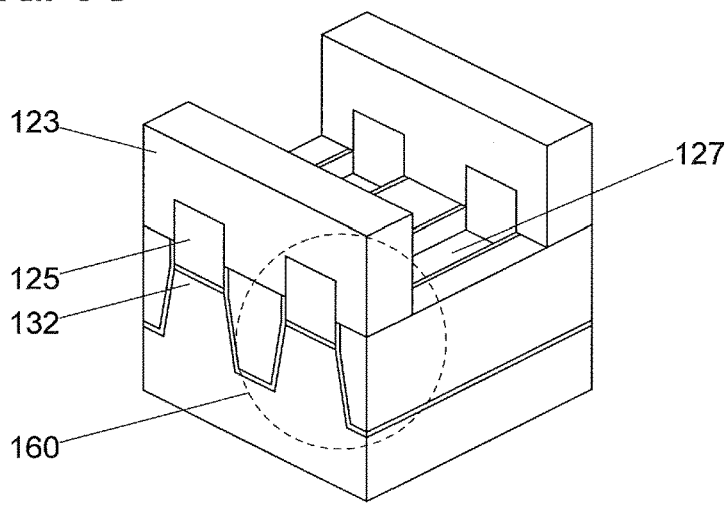
Figure 4A:
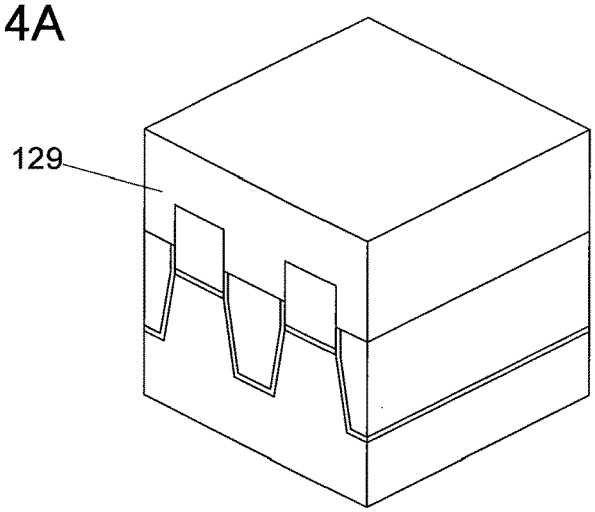
FIGS. 4A to 4C are perspective views illustrating a manufacturing process of a semiconductor device.
Figure 4B:
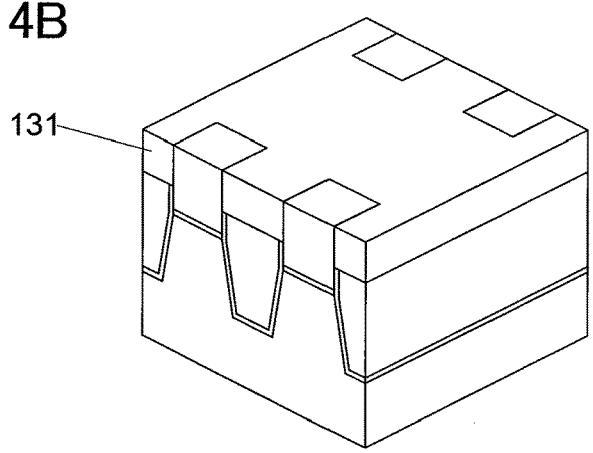

In addition, an element isolation insulating layer 121 for isolating the adjacent transistors 160 from each other is embedded in the substrate 101 as illustrated in FIG. 3B, and an insulating layer 131 is provided over the transistors 160 such that the top surface of the gate electrode 125 is exposed as illustrated in FIG. 4B. Note that in order to realize higher integration, the transistor 160 preferably has a structure without a sidewall insulating layer as illustrated in FIGS. 1A and 1B. On the other hand, in the case where characteristics of the transistor 160 have priority, a sidewall insulating layer may be provided on a side surface of the gate electrode 125, and the impurity regions 130 may include a region having a different impurity concentration.

Here, the insulating layer 131 preferably has a surface with favorable planarity; for example, the surface of the insulating layer 131 preferably has a root-mean-square (RMS) roughness of 1 nm or less. This is because the transistor 162 can have better characteristics when provided over the insulating layer 131 having a highly planar surface.

The transistor 162 in FIG. 1B includes an oxide semiconductor layer 141 formed over the insulating layer 131 and having a channel formation region, a source electrode 143 and a drain electrode 145 connected to part of the oxide semiconductor layer 141, a gate insulating layer 147 covering the oxide semiconductor layer 141, and a gate electrode 149 provided over the gate insulating layer 147 so as to overlap with the oxide semiconductor layer 141. Here, the source electrode 143 of the transistor 162 is electrically connected to the gate electrode 125 of the transistor 160, and the drain electrode 145 of the transistor 162 is electrically connected to the gate electrode of the adjacent transistor 160. It is needless to say that the connection between transistors according to the disclosed invention is not limited to this example.

Here, the oxide semiconductor layer 141 is preferably an oxide semiconductor layer which is purified by sufficiently removing an impurity such as hydrogen therefrom or by sufficiently supplying oxygen thereto. Specifically, the hydrogen concentration of the oxide semiconductor layer 141 is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration of the oxide semiconductor layer 141 is measured by secondary ion mass spectrometry (SIMS). The density of carriers generated due to a donor such as hydrogen in the oxide semiconductor layer 141, in which hydrogen is reduced to a sufficiently low concentration so that the oxide semiconductor layer is purified and in which defect states in an energy gap due to oxygen deficiency are reduced by sufficiently supplying oxygen as described above, is less than $1 \times 10^{12}$/cm$^3$, preferably less than $1 \times 10^{11}$/cm$^3$, more preferably less than $1.45 \times 10^{10}$/cm$^3$. In addition, for example, the off-state current (per unit channel width (1 µm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, the transistor 162 which has extremely favorable off-state current characteristics can be obtained.

In addition, a region which is part of a surface of the insulating layer 131 and is in contact with the oxide semiconductor layer 141 preferably has a root-mean-square (RMS) roughness of 1 nm or less. In this manner, the channel formation region of the transistor 162 is provided in an extremely flat region having a root-mean-square (RMS) roughness of 1 nm or less, whereby the transistor 162 which can prevent a malfunction such as a short-channel effect and has favorable characteristics can be provided even when the transistor 162 is miniaturized.

Here, when the transistor 162 is seen from a planar direction, portions of side surfaces of the oxide semiconductor layer 141 having the channel formation region and the source electrode 143 (or the drain electrode 145) are substantially aligned with each other. In particular, as illustrated in FIG. 5C, side surfaces of the oxide semiconductor layer 141 having the channel formation region and the source electrode 143 (or the drain electrode 145) which are parallel with a channel length direction (for example, side surfaces located in a region 157 in FIG. 1A) are substantially aligned with each other. Here, the expression "portions of side surfaces are aligned with each other when seen from a planar direction" means that side surfaces of objects overlap each other at least partly when seen from a direction perpendicular to a surface (or a rear surface) of the substrate 101. In addition, the expression "substantially aligned" does not require exact alignment. For example, the expression "substantially aligned" includes a degree of alignment in a shape obtained by etching a plurality of layers with the same mask. Furthermore, the term "channel length direction" refers to a direction from a source region toward a drain region, or the opposite direction, along the shortest path between the source region and the drain region. By formation of the transistor 162 in such a planar layout, an increase in the degree of integration of the semiconductor device including the transistor 162 can be achieved.

The capacitor 164 in FIGS. 1A and 1B includes the source electrode 143, the gate insulating layer 147, and an electrode 151 over the gate insulating layer 147. In other words, the source electrode 143 functions as one electrode of the capacitor 164, and the electrode 151 functions as the other electrode of the capacitor 164. Meanwhile, the capacitor 164 is not an essential component in an embodiment of the disclosed invention; thus, the electrode 151 or the like can be omitted as appropriate.

In an embodiment in which side surfaces (or portions thereof) of components of a transistor are aligned with each other as described above, a highly integrated semiconductor device can be realized. In particular, in a structure including three-dimensionally integrated transistors, a more significant effect can be obtained in combination with an increase in the degree of integration owing to this three-dimensional structure. Note that although the side surfaces (or portions thereof) of components of the transistors in the semiconductor device illustrated in FIGS. 1A and 1B are aligned in a plurality of regions (the region 155 and the region 157), the effect can be sufficiently obtained even when side surfaces of components are aligned in only one of the regions.

Note that the structure of a semiconductor device according to an embodiment of the disclosed invention is not limited to that illustrated in FIGS. 1A and 1B. Since the technical idea of an embodiment of the disclosed invention is to achieve an increase in the degree of integration of a semiconductor device by aligning side surfaces (or portions thereof) of components of a transistor with each other, details such as an electrode connection can be changed as appropriate.

Method for Manufacturing Semiconductor Device

Next, an example of a method for manufacturing the above-described semiconductor device will be described.

Figure 2A:
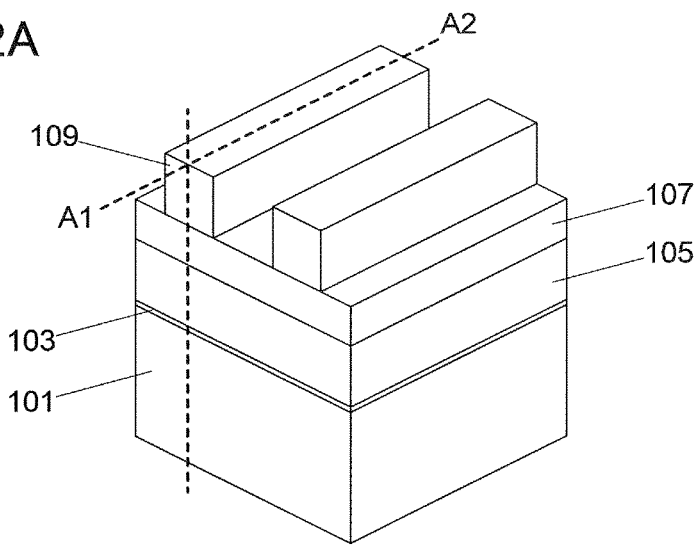
FIGS. 2A to 2C are perspective views illustrating a manufacturing process of a semiconductor device.
Figure 2B:
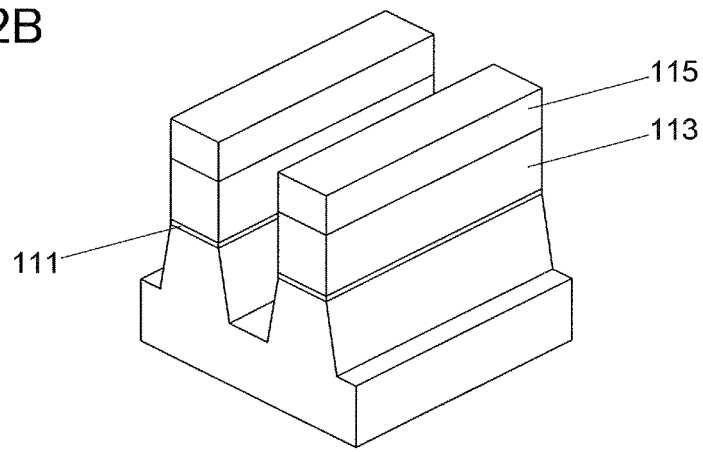

First, the substrate 101 including a semiconductor material is prepared (see FIG. 2A). Note that a cross section taken along line A1-A2 of FIG. 2A corresponds to the cross section shown in FIG. 1B. The same applies to FIGS. 2B and 2C, FIGS. 3A to 3C, FIGS. 4A to 4C, and FIGS. 5A to 5C. A single crystal semiconductor substrate or a polycrystalline semiconductor substrate of silicon, silicon carbide, or the like, a compound semiconductor substrate of silicon germanium or the like, an SOI substrate, or the like can be used as the substrate 101 including a semiconductor material. Here, an example of the case where a single crystal silicon substrate is used as the substrate 101 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer interposed therebetween.

It is particularly preferable that a single crystal semiconductor substrate of silicon or the like be used as the substrate 101 including a semiconductor material because the speed of reading operation of the semiconductor device can be increased.

Note that an impurity element may be added to a region which later functions as the channel formation region 132 of the transistor 160, in order to control the threshold voltage of the transistor. Here, an impurity element imparting conductivity is added so that the threshold voltage of the transistor 160 becomes positive. When the semiconductor material is silicon, the impurity imparting conductivity may be boron, aluminum, gallium, or the like.

Next, an insulating layer 103 is formed over the substrate 101 (see FIG. 2A). The insulating layer 103 is later processed into the gate insulating layer 111 and can be formed by, for example, heat treatment (thermal oxidation treatment, thermal nitridation treatment, or the like) of the surface of the substrate 101 including a semiconductor material. Instead of heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. It is needless to say that the insulating layer may be formed by a CVD method, a sputtering method, or the like. The insulating layer 103 preferably has a single-layer structure or a stacked-layer structure with a film including silicon oxide, silicon oxynitride, silicon nitride oxide, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The insulating layer 103 can have a thickness of 1 nm to 100 nm, preferably 10 nm to 50 nm, for example.

Next, a layer 105 including a conductive material is formed over the insulating layer 103 (see FIG. 2A). The layer 105 including a conductive material is later processed into the gate electrode 125. The layer 105 including a conductive material can be formed using a semiconductor material such as polycrystalline silicon, to which an impurity element imparting one conductivity type such as phosphorus or boron is added. The layer 105 including a conductive material may be formed using a metal material such as aluminum, copper, titanium, tantalum, or tungsten. There is no particular limitation on the method for forming the layer 105 including a conductive material, and a variety of film formation methods such as an evaporation method, a CVD method, a sputtering method, or a spin coating method can be employed.

Then, an insulating layer 107 is formed over the layer 105 including a conductive material (see FIG. 2A). The insulating layer 107 is later processed into an insulating layer 115 which protects a portion of the layer 105 including a conductive material to be the gate electrode 125 during a later step of etching the layer 105 including a conductive material. The insulating layer 107 is preferably formed using a material having an etching rate different from that of the element isolation insulating layer 121 to be formed in a later step; for example, when silicon oxide is used for the element isolation insulating layer 121, silicon nitride or the like is preferably used for the insulating layer 107.

After that, a resist mask 109 is formed over the insulating layer 107 (see FIG. 2A).

Next, a region not covered with the resist mask 109 is removed by selectively etching part of the insulating layer 107, the layer 105 including a conductive material, the insulating layer 103, and the substrate 101 with the use of the resist mask 109. Accordingly, the gate insulating layer 111, a layer 113 including a conductive material, and the insulating layer 115 are formed (see FIG. 2B). In addition, a portion of a side surface of a region later serving as the channel formation region 132 (a projecting region of the substrate 101, which is formed by the above etching step), a portion of a side surface of the gate insulating layer 111, and a portion of a side surface of the layer 113 including a conductive material, which is later processed into the gate electrode, are substantially aligned with each other when seen from a planar direction. Furthermore, the side surfaces substantially aligned with each other as described above (for example, the side surface of the region later serving as the channel formation region 132) are parallel with the channel length direction. Here, the expression "portions of side surfaces are aligned with each other when seen from a planar direction" means that side surfaces of objects overlap each other at least partly when seen from a direction perpendicular to a surface of the substrate 101. In addition, the expression "substantially aligned" does not require exact alignment. For example, the expression "substantially aligned" includes a degree of alignment in a shape obtained by etching a plurality of layers with the same mask. Furthermore, the term "channel length direction" refers to a direction from a source region toward a drain region, or the opposite direction, along the shortest path between the source region and the drain region.

By etching part of the insulating layer 107, the layer 105 including a conductive material, the insulating layer 103, and the substrate 101 at a time with the use of the resist mask 109 as described above, it becomes possible to eliminate variation in shape which may be caused by mask misalignment when the components are formed separately by etching. In that case, there is no need to leave a margin for mask alignment and it is therefore possible to sufficiently increase the degree of integration.

Note that the resist mask 109 is removed after the above etching step. As the etching, dry etching is preferably performed, but wet etching may be performed. An etching gas or an etchant can be selected as appropriate depending on a material to be etched. In addition, the layer 105 including a conductive material, the insulating layer 103, and the substrate 101 preferably include materials which are successively processable by changing etching conditions during the etching process, and preferably include, for example, materials which are successively processable by changing conditions, e.g., by changing gases, during a dry etching process. Alternatively, the layer 105 including a conductive material, the insulating layer 103, and the substrate 101 may include materials which are processable by the same process (for example, by a dry etching process using the same etching gas).

Figure 2C:
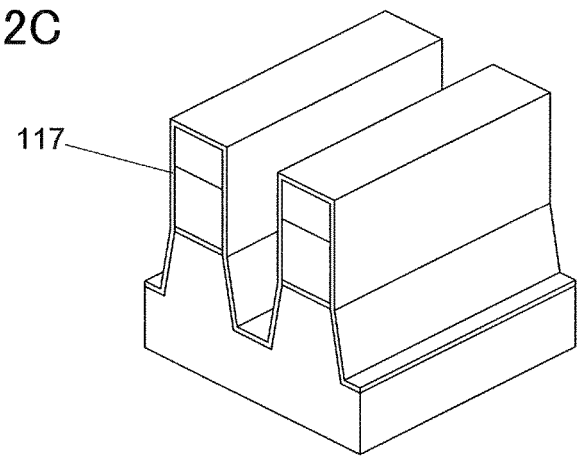

Next, an insulating layer 117 is formed so as to cover the substrate 101, the gate insulating layer 111, the layer 113 including a conductive material, and the insulating layer 115 (see FIG. 2C). There is no particular limitation on methods for forming the insulating layer 117; for example, a high-temperature oxide film can be formed using CVD. When the layer 113 including a conductive material is formed using a semiconductor material such as polycrystalline silicon to which an impurity element is added, a thermal oxide film is preferably formed by thermal oxidation. In that case, heat treatment may also be performed before or after forming the thermal oxide film. By performing thermal oxidation and heat treatment as described above, portions of the substrate 101, the gate insulating layer 111, the layer 113 including a conductive material, and the insulating layer 115 which are damaged during the above etching step can be repaired.

Next, an insulating layer 119 is formed so as to cover the substrate 101, the gate insulating layer 111, the layer 113 including a conductive material, the insulating layer 115, and the insulating layer 117 (see FIG. 3A). The insulating layer 119 is later processed into the element isolation insulating layer 121 and is formed using silicon oxide, silicon nitride, silicon oxynitride, silicon nitride oxide, or the like.

Then, the element isolation insulating layer 121 is formed by processing the insulating layer 119 so as to expose at least part of the insulating layer 115. After that, the layer 113 including a conductive material is exposed by removing the insulating layer 115 (see FIG. 3B). Methods for processing the insulating layer 119 include etching treatment, polishing treatment such as chemical mechanical polishing (CMP), and the like; one or more of these methods may be employed. Note that an example is described here in which part of the insulating layer 119 is removed by polishing treatment and etching treatment such that the upper surface of the element isolation insulating layer 121 is at a level lower than that of the upper surface of the layer 113 including a conductive material. At the same time, a portion of the insulating layer 117 above the element isolation insulating layer 121 may also be removed in some cases.

Next, a resist mask 123 is formed over the element isolation insulating layer 121 and the layer 113 including a conductive material, and the gate electrode 125 is formed by selectively etching the layer 113 including a conductive material (see FIG. 3C).

Then, by irradiating regions 127 with an impurity element such as phosphorus (P) or arsenic (As) by using, as a mask, the gate electrode 125 and the like formed by the above etching step, the channel formation region 132 and the impurity regions 130 to which the impurity element is added are formed in the substrate 101 (see FIGS. 1A and 1B and FIG. 3C). Note that phosphorus or arsenic is added here in order to form an n-type transistor; an impurity element such as boron (B) or aluminum (Al) may be added in the case of forming a p-type transistor. The concentration of the impurity added can be set as appropriate; the concentration is preferably set high when a semiconductor element is highly miniaturized. Note that it is preferable to perform heat treatment after adding the impurity element, in order to activate the impurity element or reduce defects which may be generated during addition of the impurity element.

Note that a sidewall insulating layer may be formed at the periphery of the gate electrode 125 (for example, on a side surface perpendicular to the channel length direction), and impurity regions to which the impurity element is added at a different concentration may be formed.

In addition, metal compound regions may be formed by forming a metal layer so as to cover the gate electrode 125, the impurity regions 130, and the like and performing heat treatment to cause a reaction between the metal layer and the semiconductor material. The metal layer can be formed by a variety of film formation methods such as a vacuum evaporation method, a sputtering method, and a spin coating method. The metal layer is preferably formed using a metal material which forms a low-resistance metal compound by reacting with the semiconductor material included in the substrate 101. Examples of such metal materials are titanium, tantalum, tungsten, nickel, cobalt, platinum, and the like. Note that in the case of forming such metal compound regions, part of the gate insulating layer 111 needs to be removed in advance.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer is removed after the metal compound regions are formed.

Through the above steps, the transistor 160 is formed with the use of the substrate 101 including a semiconductor material (see FIG. 3C).

Next, an insulating layer 129 is formed so as to cover the components formed in the above steps (see FIG. 4A). The insulating layer 129 can be formed using an inorganic insulating material such as silicon oxide, silicon oxynitride, silicon nitride oxide, silicon nitride, or aluminum oxide. It is particularly preferable to use a low dielectric constant (low-k) material for the insulating layer 129 because capacitance due to overlap of electrodes or wirings can be sufficiently reduced. Note that a porous insulating layer with such a material may be employed as the insulating layer 129. The porous insulating layer has a lower dielectric constant than an insulating layer with high density and thus makes it possible to further reduce capacitance due to electrodes or wirings. Alternatively, the insulating layer 129 can be formed using an organic insulating material such as polyimide or acrylic. The insulating layer 129 may have a single-layer structure or a stacked-layer structure including two or more layers and can have, for example, a three-layer structure of a silicon oxynitride layer, a silicon nitride oxide layer, and a silicon oxide layer stacked in this order from the bottom.

After that, by performing CMP treatment of the insulating layer 129 before the formation of the transistor 162 and the capacitor 164, the insulating layer 131 is formed such that the upper surface of the gate electrode 125 is exposed (see FIG. 4B). As treatment for exposing the upper surface of the gate electrode 125, etching treatment or the like can be employed instead of the CMP treatment. Note that in order to improve characteristics of the transistor 162, the surface of the insulating layer 131 is preferably made as flat as possible; in this regard, the CMP treatment is preferable. In the case of using the CMP treatment, the surface of the insulating layer 131 can have a root-mean-square (RMS) roughness of 1 nm or less, for example.

Note that before or after each of the above steps, a step of forming an electrode, a wiring, a semiconductor layer, an insulating layer, or the like may be further performed. For example, when the wiring has a multilayer wiring structure of a stacked-layer structure including insulating layers and conductive layers, a highly integrated semiconductor device can also be realized.

Figure 4C:
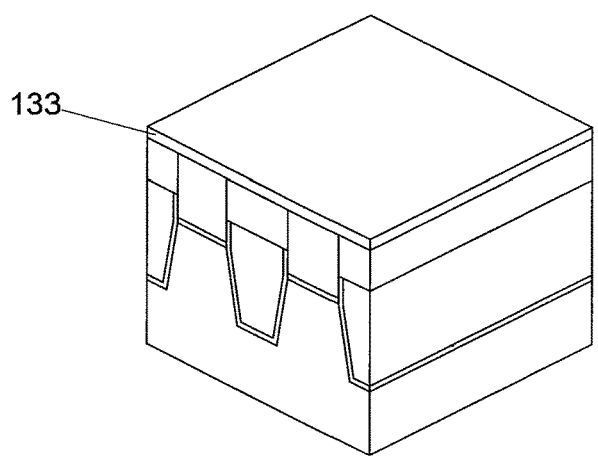

Next, an oxide semiconductor layer 133 is formed over the insulating layer 131, the gate electrode 125, and the like (see FIG. 4C). The oxide semiconductor layer 133 is later processed into the oxide semiconductor layer 141 which is a component of the transistor 162. Note that an insulating layer functioning as a base may be provided over the insulating layer 131. The insulating layer can be formed by a PVD method, a CVD method, or the like. In that case, an opening is preferably formed in the insulating layer functioning as a base so as to expose the upper surface of the gate electrode 125.

A material used for the oxide semiconductor layer 133 contains at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

Note that an In—Ga—Zn—O-based oxide semiconductor has sufficiently high resistance when there is no electric field and thus off-state current can be sufficiently reduced. In addition, also having high field-effect mobility, the In—Ga—Zn—O-based oxide semiconductor is suitable for a semiconductor material used in a semiconductor device.

As a typical example of the In—Ga—Zn—O-based oxide semiconductor, an oxide semiconductor material represented by a chemical formula $InMO_3(ZnO)_m$ (m>0) is given. Here, M represents one or more metal elements selected from Zn, Ga, Al, Mn, and Co. For example, M can be Ga, Ga and Al, Ga and Mn, Ga and Co, or the like. Note that the above-described compositions are derived from the crystal structures that the oxide semiconductor material can have and are mere examples.

As a target used for forming the oxide semiconductor layer 133 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=1) (i.e., a composition ratio of $In_2O_3$:$Ga_2O_3$:ZnO=1:1:2 [molar ratio]) can be used. In addition, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can also be used.

In this embodiment, an oxide semiconductor layer having an amorphous structure is formed as the oxide semiconductor layer 133 by a sputtering method with the use of an In—Ga—Zn—O-based metal oxide target. The thickness ranges from 1 nm to 50 nm, preferably from 2 nm to 20 nm, more preferably from 3 nm to 15 nm.

In the case where the oxide semiconductor layer 133 is formed by a sputtering method using an In—Zn—O-based metal oxide target, the target used has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X Y:Z, the relation of Z>1.5X+Y is satisfied.

The relative density of the metal oxide in the metal oxide target is 80% or more, preferably 95% or more, and more preferably 99.9% or more. The use of the metal oxide target with high relative density makes it possible to form an oxide semiconductor layer having a dense structure.

The atmosphere in which the oxide semiconductor layer 133 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer 133, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 133 may be room temperature (25° C.±10° C.). Then, moisture in the treatment chamber is removed, a sputtering gas from which hydrogen, water, or the like is removed is introduced, and the above-described target is used; thus, the oxide semiconductor layer 133 is formed. By forming the oxide semiconductor layer 133 while heating the object to be processed, an impurity in the oxide semiconductor layer 133 can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer 133 can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (such as powder substances generated in film formation) can be reduced and the film thickness can be made uniform. The appropriate thickness of the oxide semiconductor layer 133 differs depending on the oxide semiconductor material to be used, the intended use of the semiconductor device, or the like; therefore, the thickness can be determined as appropriate in accordance with the material, the intended use, or the like. Note that when the insulating layer 131 is formed in the above manner, a surface over which a portion corresponding to the channel formation region in the oxide semiconductor layer 133 is to be formed can be sufficiently planarized; thus, the oxide semiconductor layer can be suitably formed even when having a small thickness. In addition, because the portion corresponding to the channel formation region in the oxide semiconductor layer 133 can be planarized, the leakage current can be made smaller than that in the case where the portion is not planarized.

Note that before the oxide semiconductor layer 133 is formed by a sputtering method, reverse sputtering in which plasma is generated with an argon gas introduced may be performed so that a material attached to a formation surface (e.g., a surface of the insulating layer 131) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After formation of the oxide semiconductor layer 133, heat treatment (first heat treatment) is preferably performed on the oxide semiconductor layer 133. Through the first heat treatment, excess hydrogen (including water or a hydroxyl group) in the oxide semiconductor layer 133 can be removed, the structure of the oxide semiconductor layer 133 can be ordered, and defect states in an energy gap can be reduced. For example, the temperature of the first heat treatment can be set higher than or equal to 300° C. and lower than 550° C., preferably higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after an oxide semiconductor layer 135 is formed, after the oxide semiconductor layer 141 is formed, after the gate insulating layer 147 is formed, or after the gate electrode 149 is formed. Such dehydration treatment or dehydrogenation treatment may be performed once or plural times.

Figure 5A:
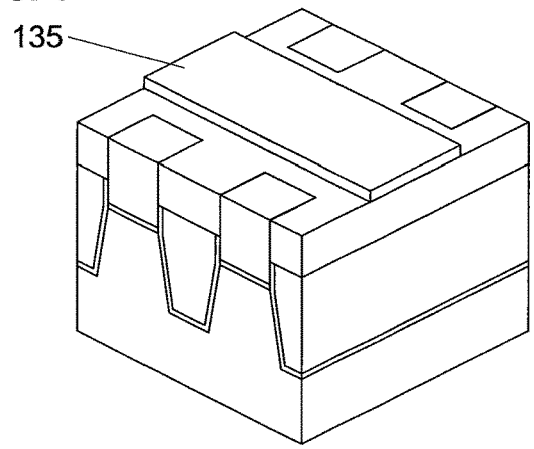
FIGS. 5A to 5C are perspective views illustrating a manufacturing process of a semiconductor device.

Next, the oxide semiconductor layer 135 is formed by selectively etching the oxide semiconductor layer 133 (see FIG. 5A). The length of the oxide semiconductor layer 141 in the channel length direction is determined by this etching step. The oxide semiconductor layer 133 is preferably etched by dry etching in terms of element miniaturization, but may be etched by wet etching. An etching gas or an etchant can be selected as appropriate depending on a material to be etched.

Figure 5B:
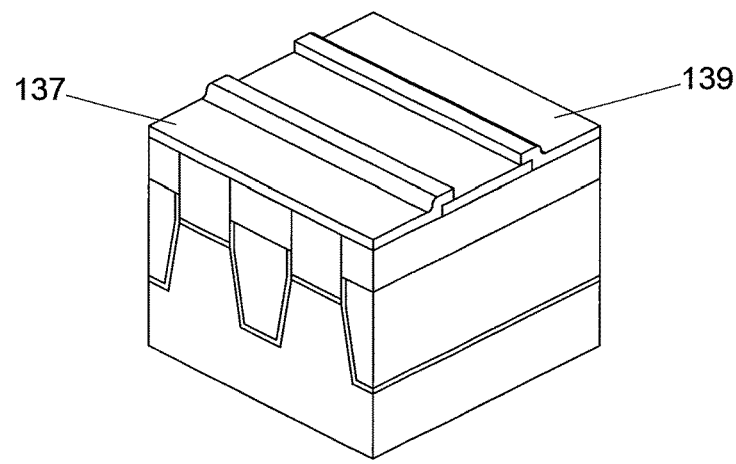
Figure 5C:
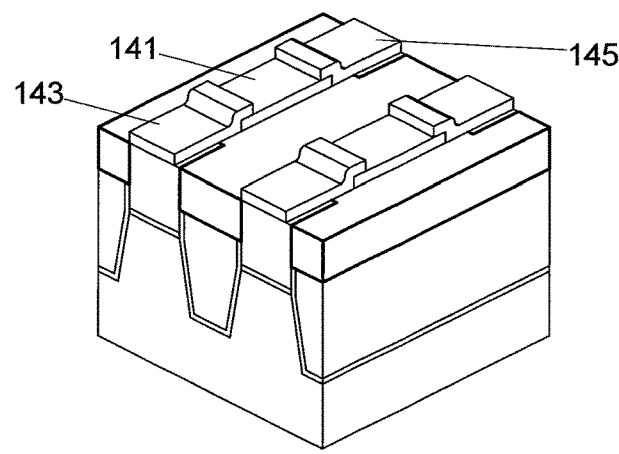

Next, a conductive layer is formed so as to cover the gate electrode 125, the insulating layer 131, and the oxide semiconductor layer 135 and is then selectively etched; thus, a conductive layer 137 and a conductive layer 139 are formed (see FIG. 5B). The conductive layer 137 and the conductive layer 139 are later processed into the source electrode 143 and the drain electrode 145. Note that before the conductive layer is formed, a protective insulating layer may be formed over the oxide semiconductor layer 135 in order to prevent the oxide semiconductor layer 135 from being damaged in the step of etching the conductive layer.

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source electrode 143 and the drain electrode 145 having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), any of these metal oxide materials including silicon or silicon oxide, or the like can be used.

Although either dry etching or wet etching may be performed as the etching of the conductive layer, dry etching with high controllability is preferably used for miniaturization. The etching may be performed so that the source electrode 143 and the drain electrode 145 to be formed have a tapered shape. The taper angle can be, for example, greater than or equal to 30° and less than or equal to 60°.

The channel length (L) of the transistor 162 is determined by a distance between lower edge portions of the conductive layer 137 and the conductive layer 139 (the source electrode 143 and the drain electrode 145). Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet rays is high and the depth of focus is large. For these reasons, the channel length (L) of the transistor to be formed later can be made sufficiently small, and accordingly, the circuit can operate at higher speed.

Next, the oxide semiconductor layer 141, the source electrode 143, and the drain electrode 145 are formed by selectively etching the oxide semiconductor layer 135, the conductive layer 137, and the conductive layer 139 (see FIG. 5C). By this etching step, a portion of a side surface of the oxide semiconductor layer 141 and a portion of a side surface of the source electrode 143 (or a portion of a side surface of the drain electrode 145) are substantially aligned with each other when seen from a planar direction. Furthermore, the side surfaces substantially aligned with each other as described above (for example, the side surface of the oxide semiconductor layer 141) are parallel with the channel length direction. Here, the expression "portions of side surfaces are aligned with each other when seen from a planar direction" means that side surfaces of objects overlap each other at least partly when seen from a direction perpendicular to a surface of the substrate 101. In addition, the expression "substantially aligned" does not require exact alignment. For example, the expression "substantially aligned" includes a degree of alignment in a shape obtained by etching a plurality of layers with the same mask. Furthermore, the term "channel length direction" refers to a direction from the source electrode 143 toward the drain electrode 145, or the opposite direction, along the shortest path between the source electrode 143 and the drain electrode 145.

By etching the oxide semiconductor layer 135, the conductive layer 137, and the conductive layer 139 at a time as described above, it becomes possible to eliminate variation in shape which may be caused by mask misalignment when the components are formed separately by etching. In that case, there is no need to leave a margin for mask alignment and it is therefore possible to sufficiently increase the degree of integration.

Note that the oxide semiconductor layer 135, the conductive layer 137, and the conductive layer 139 are preferably etched by dry etching in terms of element miniaturization, but may be etched by wet etching. An etching gas or an etchant can be selected as appropriate depending on a material to be etched. In addition, the oxide semiconductor layer 135, the conductive layer 137, and the conductive layer 139 preferably include materials which are successively processable by changing etching conditions during the etching step, and preferably include, for example, materials which are successively processable by changing conditions, e.g., by changing gases, during a dry etching step. Alternatively, the oxide semiconductor layer 135, the conductive layer 137, and the conductive layer 139 may include materials which are processable by the same process (for example, by a dry etching process using the same etching gas).

Next, the gate insulating layer 147 is formed so as to cover the oxide semiconductor layer 141 (see FIGS. 1A and 1B). The gate insulating layer 147 can be formed by a CVD method, a sputtering method, or the like. The gate insulating layer 147 is preferably formed so as to contain silicon oxide, silicon nitride, silicon oxynitride, silicon nitride oxide, aluminum oxide, tantalum oxide, hafnium oxide, yttrium oxide, gallium oxide, hafnium silicate ($HfSi_xO_y$ (x>0, y>0)), hafnium aluminate ($HfAl_xO_y$ (x>0, y>0)), hafnium silicate to which nitrogen is added, hafnium aluminate to which nitrogen is added, or the like. The gate insulating layer 147 may have a single-layer structure or a stacked-layer structure. There is no particular limitation on the thickness of the gate insulating layer 147; the thickness is preferably small in order to ensure the operation of the transistor when the semiconductor device is miniaturized.

Note that when the gate insulating layer is thin, gate leakage due to a tunneling effect or the like becomes a problem. In order to solve the problem of gate leakage, the gate insulating layer 147 may be formed using a high dielectric constant (high-k) material such as hafnium oxide, tantalum oxide, yttrium oxide, hafnium silicate, hafnium silicate to which nitrogen is added, or hafnium aluminate to which nitrogen is added. The use of a high-k material for the gate insulating layer 147 makes it possible to increase the thickness in order to suppress gate leakage as well as ensuring electrical properties. For example, the relative permittivity of hafnium oxide is approximately 15, which is much higher than that of silicon oxide which is 3 to 4. Therefore, it is possible to increase the thickness of the gate insulating layer as well as ensuring electrical properties. Note that a stacked-layer structure of a film including a high-k material and a film including any of silicon oxide, silicon nitride, silicon oxynitride, silicon nitride oxide, aluminum oxide, and the like may also be employed.

After the gate insulating layer 147 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 147 contains oxygen, oxygen is supplied to the oxide semiconductor layer 141 and oxygen vacancies in the oxide semiconductor layer 141 are filled.

Note that the second heat treatment is performed in this embodiment after the gate insulating layer 147 is formed; there is no limitation on the timing of the second heat treatment. For example, the second heat treatment may be performed after the gate electrode is formed.

By reducing impurities and filling oxygen vacancies in the oxide semiconductor layer 141 by performing the first heat treatment and the second heat treatment as described above, the oxide semiconductor layer 141 can be purified so as to contain impurities other than main components as little as possible.

Note that oxygen plasma treatment may be performed instead of the second heat treatment or at the same time as the second heat treatment. Also by the oxygen plasma treatment, oxygen can be supplied to the oxide semiconductor layer 141 and oxygen vacancies in the oxide semiconductor layer 141 can be filled.

Next, the gate electrode 149 and the electrode 151 are formed over the gate insulating layer 147 (see FIGS. 1A and 1B).

The gate electrode 149 and the electrode 151 can be formed by forming a conductive layer over the gate insulating layer 147 and then by selectively etching the conductive layer. The conductive layer to be the gate electrode 149 and the electrode 151 can be formed by a PVD method such as a sputtering method, or a CVD method such as a plasma CVD method. The details are similar to those of the source electrode 143, the drain electrode 145, or the like; thus, the description thereof can be referred to.

Through the above steps, the transistor 162 including the oxide semiconductor layer 141 and the capacitor 164 including the source electrode 143, the electrode 151, and the gate insulating layer 147 are completed (see FIGS. 1A and 1B). Note that the transistor 162 includes the oxide semiconductor layer 141 which is i-type (intrinsic) or substantially intrinsic, and therefore exhibits highly excellent characteristics.

Note that the transistor 162 manufactured through the above steps has the feature of sufficiently small off-state current.

After the above steps, an insulating layer may be formed so as to cover the gate insulating layer 147, the gate electrode 149, and the electrode 151. The insulating layer can be formed by a PVD method, a CVD method, or the like. The insulating layer can be formed so as to have a single-layer structure or a stacked-layer structure using a material including an inorganic insulating material such as silicon oxide, silicon oxynitride, silicon nitride oxide, silicon nitride, hafnium oxide, or aluminum oxide.

The insulating layer is preferably formed using a low dielectric constant material or a low dielectric constant structure (such as a porous structure). This is because when the insulating layer has a low dielectric constant, capacitance generated between wirings, electrodes, or the like can be reduced and operation at higher speed can be achieved.

In addition, the insulating layer is desirably formed so as to have a flat surface. This is because when the insulating layer has a flat surface, an electrode, a wiring, or the like can be favorably formed over the insulating layer even in the case where the semiconductor device or the like is miniaturized. Note that the insulating layer can be planarized using a method such as chemical mechanical polishing (CMP).

In addition, a variety of wirings, electrodes, or the like may be formed after the above steps. The wirings or the electrodes can be formed by a method such as a so-called damascene method or dual damascene method.

Through the above steps, the semiconductor device having the structure illustrated in FIGS. 1A and 1B can be manufactured.

In an embodiment in which side surfaces (or portions thereof) of components of a transistor are aligned with each other as described above in this embodiment, a highly integrated semiconductor device can be realized. In particular, in a structure including three-dimensionally integrated transistors, a more significant effect can be obtained in combination with an increase in the degree of integration owing to this three-dimensional structure.

The configurations, methods, and the like described in this embodiment can be combined as appropriate with any of the configurations, methods, and the like described in the other embodiments.

Embodiment 2

In this embodiment, an example of application of a semiconductor device according to one embodiment of the disclosed invention will be described with reference to FIGS. 6A-1, 6A-2, and 6B and FIGS. 7 to 10. Here, an example of a memory device is described. Note that in some circuit diagrams, "OS" is written beside a transistor in order to indicate that the transistor includes an oxide semiconductor.

Basic Circuit

First, a basic circuit configuration and an operation thereof will be described with reference to FIGS. 6A-1, 6A-2, and 6B. In a semiconductor device illustrated in FIG. 6A-1, a first wiring (1st Line) is electrically connected to a source electrode (or a drain electrode) of a transistor 160. A second wiring (2nd Line) is electrically connected to a drain electrode (or a source electrode) of the transistor 160. A third wiring (3rd Line) is electrically connected to a source electrode (or a drain electrode) of a transistor 162. A fourth wiring (4th Line) is electrically connected to a gate electrode of the transistor 162. A gate electrode of the transistor 160 and a drain electrode (or a source electrode) of the transistor 162 are electrically connected to one electrode of a capacitor 164. A fifth wiring (5th Line) is electrically connected to the other electrode of the capacitor 164.

Here, as the transistor 162, the transistor 162 including an oxide semiconductor as described in the above embodiment can be used. A transistor including an oxide semiconductor has a characteristic of a significantly small off-state current. For that reason, a potential of the gate electrode of the transistor 160 can be held for an extremely long period by turning off the transistor 162. By providing the capacitor 164, holding of charge applied to the gate electrode of the transistor 160 and reading of data held can be performed more easily.

Although there is no particular limitation on the transistor 160, the transistor 160 described in the above embodiment is preferably used. In terms of increasing the speed of reading data, it is preferable to use a transistor with high switching speed such as a transistor formed using single crystal silicon, for example.

Figures 1, 6A:
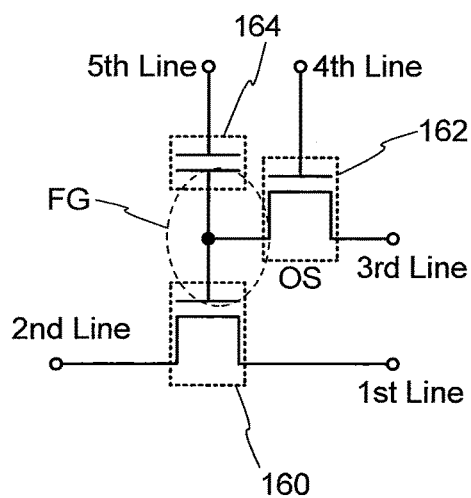
FIGS. 6A-1, 6A-2, and 6B are circuit diagrams of a semiconductor device.
Figure 6B:
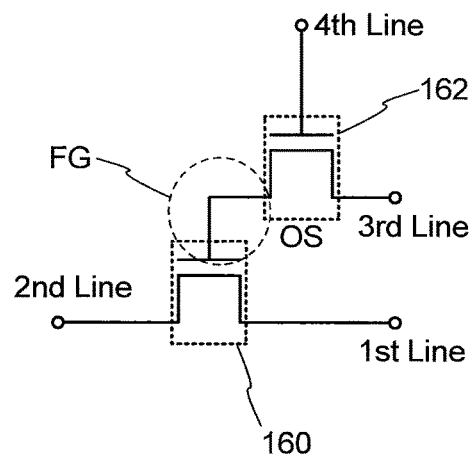

Alternatively, a structure in which the capacitor 164 is not provided is also possible as illustrated in FIG. 6B.

The semiconductor device in FIG. 6A-1 utilizes a characteristic in which the potential of the gate electrode of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potentials (hereinafter, a charge providing a low potential is referred to as charge $Q_L$ and a charge providing a high potential is referred to as charge $Q_H$) is applied. Note that three or more kinds of charges providing different potentials may be applied to improve storage capacity. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge supplied to the gate electrode of the transistor 160 can be determined. For example, in the case where $Q_H$ is supplied in writing, when the potential of the fifth wiring is $V_0$ ($>V_{th\_H}$), the transistor 160 is turned on. In the case where $Q_L$ is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed to be used, it is necessary that data of only a desired memory cell can be read. In the case where data of a predetermined memory cell are read and data of the other memory cells are not read, fifth wirings in memory cells that are not a target for reading are supplied with a potential at which the transistors 160 are turned off regardless of the state of the gate electrodes, that is, a potential lower than $V_{th\_H}$. Alternatively, fifth wirings are supplied with a potential at which the transistors 160 are turned on regardless of the state of the gate electrodes, that is, a potential higher than $V_{th\_L}$.

Next, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (a potential for new data) is supplied to the gate electrode of the transistor 160 and to the capacitor 164. After that, the potential of the fourth wiring is set to a potential at which the transistor 162 is turned off, so that the transistor 162 is turned off. Accordingly, the gate electrode of the transistor 160 is supplied with charge for new data.

In the semiconductor device according to an embodiment of the disclosed invention, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the drain electrode (or the source electrode) of the transistor 162 is electrically connected to the gate electrode of the transistor 160 and therefore has a function similar to that of a floating gate of a floating gate transistor used for a nonvolatile memory element. A portion where the drain electrode (or the source electrode) of the transistor 162 and the gate electrode of the transistor 160 are electrically connected to each other is called a node FG in some cases. When the transistor 162 is turned off, the node FG can be regarded as being embedded in an insulator and thus charge is held at the node FG. The off-state current of the transistor 162 including an oxide semiconductor is smaller than or equal to $1/100000$ of the off-state current of a transistor including a silicon semiconductor; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to an embodiment of the disclosed invention does not have the problem of deterioration of a gate insulating film (a tunnel insulating film), which is a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figures 2, 6A:
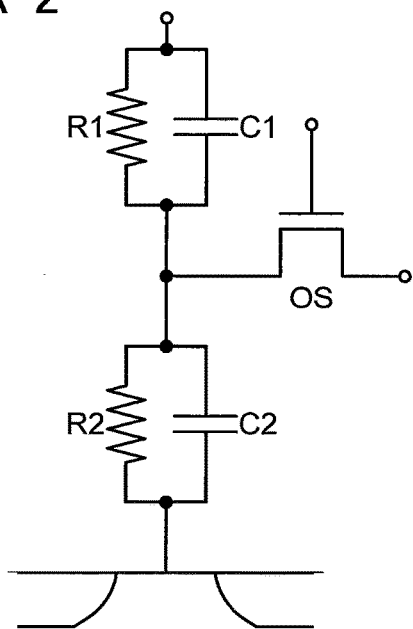

Components such as transistors in the semiconductor device in FIG. 6A-1 can be regarded as including resistors and capacitors as illustrated in FIG. 6A-2. That is, in FIG. 6A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≥ROS and R2≥ROS, where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that it is preferable that the semiconductor device disclosed in this embodiment satisfies the above relationships of R1≥ROS and R2≥ROS.

Meanwhile, it is desirable that C1 and C2 satisfy C1≥C2. This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

In the case where the relative permittivity $\varepsilon r1$ of the insulating layer included in the capacitor 164 is different from the relative permittivity $\varepsilon r2$ of the insulating layer included in the transistor 160, it is easy to satisfy $C1 \geq C2$ while satisfying $2 \cdot S2 \geq S1$ (preferably $S2 \geq S1$), where S1 is the area of the insulating layer included in the capacitor 164 and S2 is the area of the insulating layer forming a gate capacitor of the transistor 160. In other words, C1 can easily be made greater than or equal to C2 while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that $\varepsilon r1$ can be set to 10 or more, preferably 15 or more, and silicon oxide is used for the insulating layer forming the gate capacitor so that $\varepsilon r2$ can be set to approximately 3 to 4.

A combination of such structures enables the semiconductor device according to one embodiment of the disclosed invention to have further higher integration.

Note that in addition to the increase in the degree of integration, a multilevel technique can be employed to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q providing a potential to the gate electrode of the transistor 160, in addition to charge $Q_L$ providing a low potential and charge $Q_H$ providing a high potential as described above.

Application Example

Next, a more specific circuit configuration to which the circuit illustrated in FIGS. 6A-1, 6A-2, and 6B is applied and an operation thereof will be described with reference to FIGS. 7 to 10.

Figure 7:
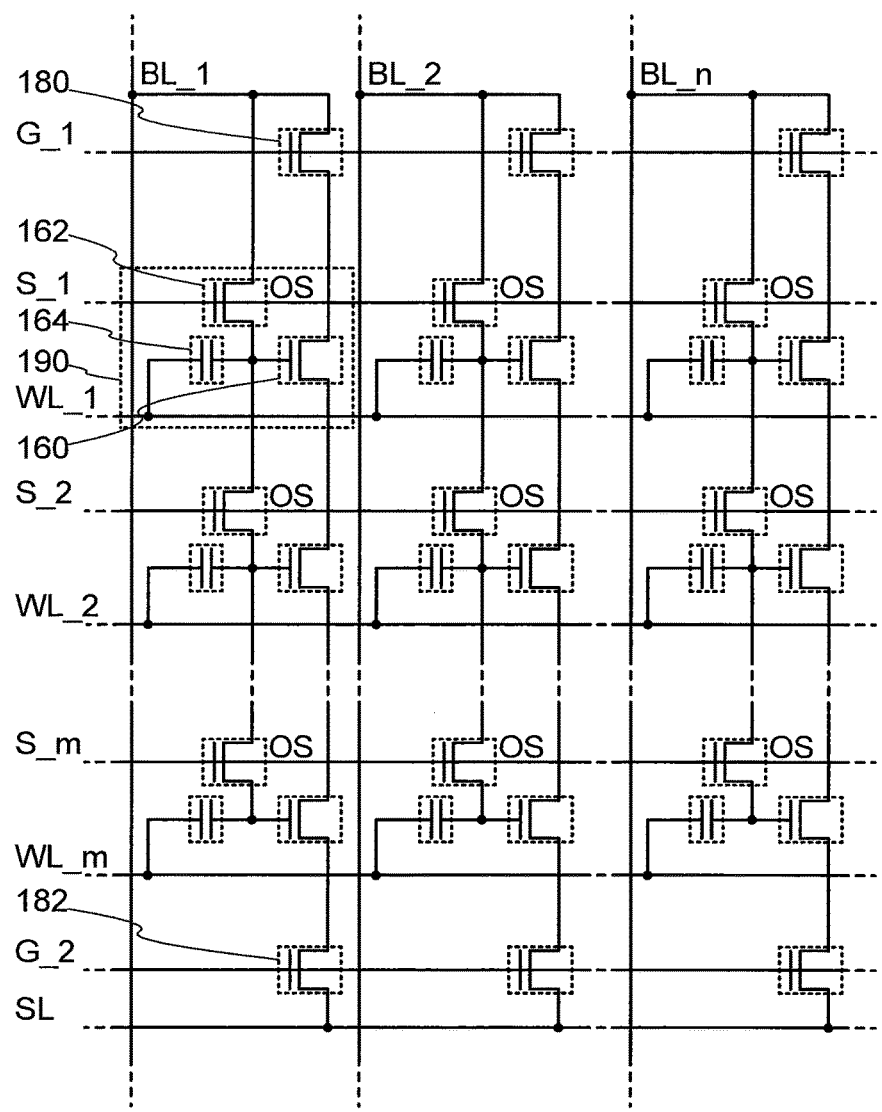
FIG. 7 is a circuit diagram of a semiconductor device.

FIG. 7 is an example of a circuit diagram of a semiconductor device including m (rows) (in a vertical direction)×n (columns) (in a horizontal direction) memory cells 190. The configuration of the memory cells 190 in FIG. 7 is similar to that in FIG. 6A-1. That is, the first wiring and the third wiring in FIG. 6A-1 correspond to a bit line BL in FIG. 7; the second wiring in FIG. 6A-1, a source line SL in FIG. 7; the fourth wiring in FIG. 6A-1, a signal line S in FIG. 7; and the fifth wiring in FIG. 6A-1, a word line WL in FIG. 7. Note that in FIG. 7, the memory cells 190 in a column direction are connected in series in such a manner that the transistors 162 are connected in series and the transistors 160 are connected in series; thus, only the memory cells 190 in the first row are connected to the bit lines BL not through other memory cells 190, and only the memory cells 190 in the m-th row are connected to the source line SL not through other memory cells 190. The memory cells 190 in the other rows are electrically connected to the bit lines BL and the source line SL through other memory cells 190 of the same columns.

The semiconductor device illustrated in FIG. 7 includes m (m is an integer greater than or equal to 2) word lines WL; m signal lines S; n (n is an integer greater than or equal to 2) bit lines BL; a memory cell array having the memory cells 190 in a matrix of m (rows) (in the vertical direction)×n (columns) (in the horizontal direction); a source line SL; a selection line G_1 and a selection line G_2; n selection transistors 180 which are arranged along the selection line G_1 and between the bit lines BL and the memory cells 190 in the first row and whose gate electrodes are electrically connected to the selection line G_1; and n selection transistors 182 which are arranged along the selection line G_2 and between the memory cells 190 in the m-th row and the source line SL and whose gate electrodes are electrically connected to the selection line G_2.

That is, the bit lines BL are electrically connected to the drain electrodes of the transistors 162 in the memory cells 190 in the first row, and are electrically connected to the drain electrodes of the transistors 160 in the memory cells 190 in the first row through the selection transistors 180. The source line SL is electrically connected to the source electrodes of the transistors 160 in the memory cells 190 in the m-th row through the selection transistors 182. The signal line S in the k-th row (k is a natural number greater than or equal to 1 and smaller than or equal to m) is electrically connected to the gate electrodes of the transistors 162 in the memory cells 190 in the k-th row. The word line WL in the k-th row is electrically connected to one electrode of each of the capacitors 164 in the memory cells 190 in the k-th row.

The drain electrodes of the transistors 160 in the memory cells 190 in the l-th row (l is a natural number greater than or equal to 2 and smaller than or equal to m) are electrically connected to the source electrodes of the transistors 160 in the memory cells 190 in the (l−1)-th row.

The drain electrodes of the transistors 162 in the memory cells 190 in the l-th row are electrically connected to the gate electrodes of the transistors 160, the source electrodes of the transistors 162, and the other electrode of each of the capacitors 164 in the memory cells 190 in the (l−1)-th row. In each of the memory cells 190 in the m-th row, the gate electrode of the transistor 160, the source electrode of the transistor 162, and the other electrode of the capacitor 164 are electrically connected to each other. That is, in the semiconductor device illustrated in FIG. 7, the node FG in each of the memory cells 190 in the (l−1)-th row has the structure in FIG. 6A-1, and in addition, is electrically connected to the drain electrode of the transistor 162 in the memory cell 190 in the l-th row. Here, the transistors 162 each including an oxide semiconductor in the l-th row and in the (l−1)-th row have significantly small off-state current; thus, in each of the memory cells 190 in the semiconductor device illustrated in FIG. 7, the potential of the node FG can be held for a long time by turning off the transistor 162 as in the semiconductor device illustrated in FIG. 6A-1.

Figure 8:
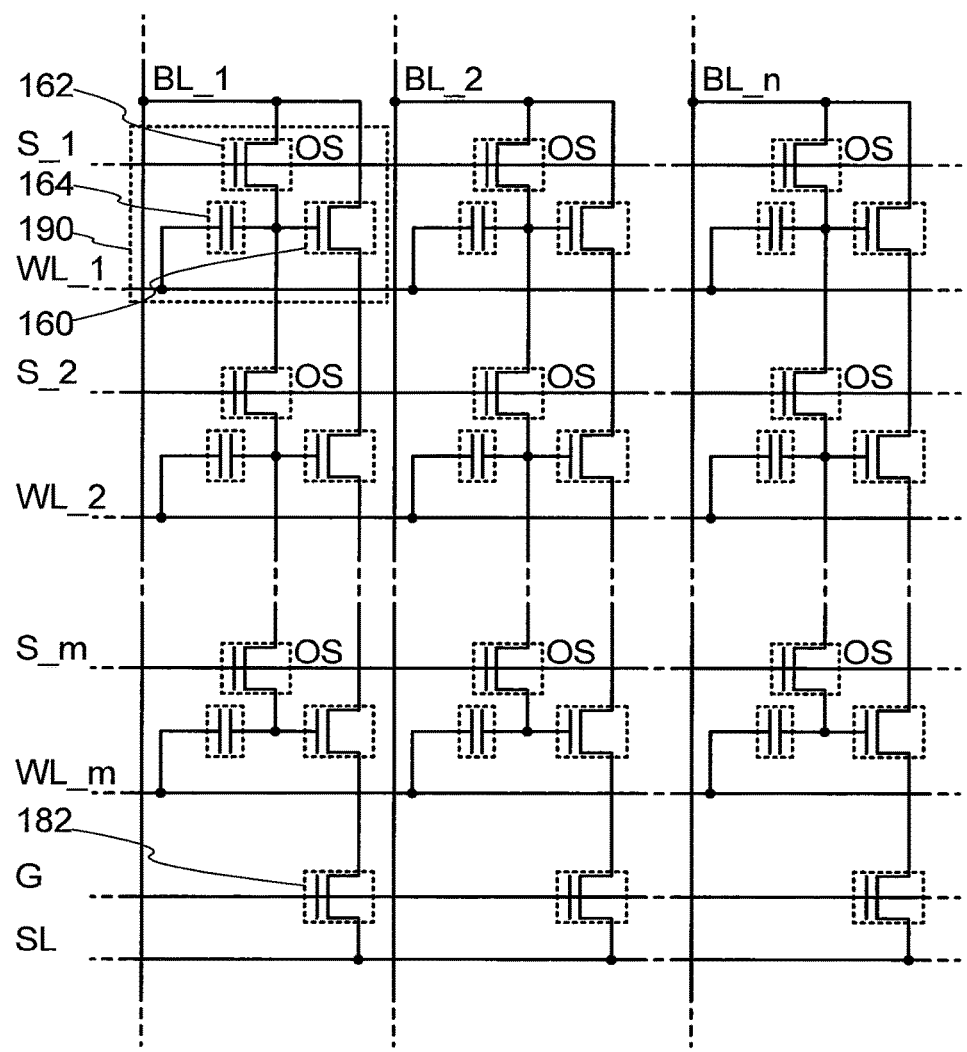
FIG. 8 is a circuit diagram of a semiconductor device.

Note that the selection line G_1, the selection line G_2, the selection transistors 180, and the selection transistors 182 are not necessarily provided. The selection line G_1 and the selection transistors 180 may be omitted. Alternatively, the selection line G_2 and the transistors 182 may be omitted. For example, as illustrated in FIG. 8, a structure may be employed in which only a selection line G corresponding to the selection line G_2 and the selection transistors 182 are provided.

Data writing, holding, and reading are basically similar to those in the case of FIGS. 6A-1, 6A-2, and 6B. Note that data writing is performed at least on a row basis, and is performed sequentially from row to row. Specifically, data writing is sequentially performed from a row including memory cells which is far from the bit lines to a row including memory cells which is close to the bit lines. This is because the node FG of one of the memory cells 190 is connected to the node FG of the adjacent memory cell 190 through the transistor 162, and thus, writing to one memory cell affects another memory cell between the memory cell to be written and the bit line, which makes it difficult to perform writing operation of each memory cell. A specific writing operation is as described below. Note that although the case where either a potential V2 (a potential lower than a power supply potential VDD) or a reference potential GND (also expressed as 0 V) is supplied to the node FG is described here as an example, the relationship among potentials supplied to the node FG is not limited to this example. Data that is held when the potential V2 is supplied to the node FG is referred to as data "1", and data that is held when the reference potential GND is supplied to the node FG is referred to as data "0".

First, the potential of the selection line G_1 is set to GND (0 V), the potential of the selection line G_2 is set to V1 (e.g., VDD), and the potential of the signal line S connected to the memory cells 190 to which data is to be written is set to V3 (a potential higher than V2, for example, VDD) so that the memory cells 190 are selected. Note that in the case where other memory cells 190 are present between the memory cells 190 to which data is to be written and the bit lines BL, the potential of the signal line S which is connected to the other memory cells 190 is set to V3; thus, the potential of the bit lines BL can be supplied to the memory cells 190 to which data is to be written.

In the case of writing data "0" to the memory cells 190, GND is supplied to the bit lines BL, and in the case of writing data "1" to the memory cells 190, V2 is supplied to the bit lines BL. Because the potential of the signal line S is V3 here, V2 can be supplied to the nodes FG.

Data is held by setting the potential of the signal line S connected to the memory cells 190 in which data is to be held to GND. When the potential of the signal line S is fixed to GND, the potential of the nodes FG is fixed to the potential at the time of writing. In other words, when V2 for data "1" is supplied to the nodes FG, the potential of the nodes FG is V2, and when GND for data "0" is supplied to the nodes FG, the potential of the nodes FG is GND.

Because GND is supplied to the signal line S, the transistors 162 are turned off regardless of whether data "1" or data "0" is written. Since the off-state current of the transistors 162 is significantly small, the charge of the gate electrodes of the transistors 160 is held for a long time. Note that after this operation for holding data, data is written to the adjacent memory cells 190 (which are closer to the bit lines BL). The details are as described above.

Data is read by setting the potential of the word line WL connected to the memory cells 190 from which data is to be read to GND, setting the potentials of the word lines WL connected to the memory cells 190 from which data is not to be read to V5 (e.g., VDD), and setting the potentials of the selection line G_1 and the selection line G_2 to V1.

When the potential of the word line WL connected to the memory cells 190 from which data is to be read is set to GND, the transistors 160 are turned on if V2 for data "1" is supplied to the nodes FG of the memory cells 190 from which data is to be read. On the other hand, the transistors 160 are turned off if GND for data "0" is supplied to the nodes FG.

When the potentials of the word lines WL connected to the memory cells 190 from which data is not to be read are set to V5, the transistors 160 are turned on regardless of whether data "1" or data "0" is written in the memory cells 190 from which data is not to be read.

Note that in the structure of FIG. 7, the transistors 162 included in the memory cells 190 are connected in series, so that it is difficult to rewrite only data in an arbitrary row. This is because, in the case of rewriting a certain row, data is also written to a row including memory cells which is closer to the bit lines than the row to be rewritten. Therefore, in the writing operation, data is preferably written sequentially from the memory cells in the row which is farthest from the bit lines BL. Note that writing operation for rewriting data of a row which has just been written is effective. Note that operation for erasing data of a plurality of rows at a time may be performed in the above driving method. For example, in the case where rows in which the transistors 162 are connected in series between the bit lines BL and the source line SL are regarded as one block, data erasing can be performed on a block basis. In the case where data in a predetermined block is rewritten, it is preferable that data in the block be erased, and then data writing be sequentially performed from the memory cells 190 in the row which is farthest from the bit lines BL. Note that in the case of rewriting data of a row which has just been written, erasing operation is unnecessary.

Figure 9:
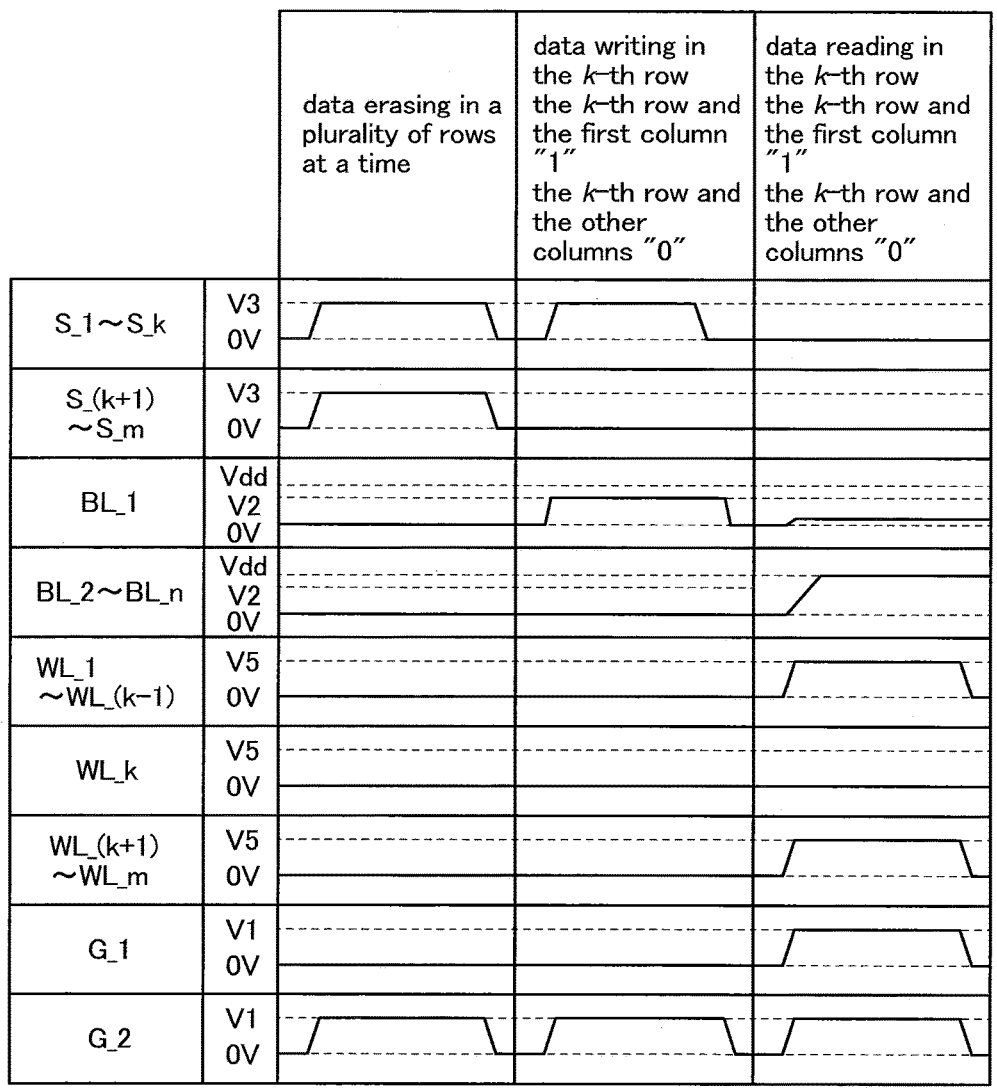
FIG. 9 illustrates a timing chart.

FIG. 9 is an example of a timing chart for more detailed operations of the semiconductor device in FIG. 7. S, BL, and the like in the timing chart denote the lines to which the potentials in the timing chart are applied. Lines having a similar function are distinguished by "_1", "_2", and the like added to the end of their names.

The timing chart in FIG. 9 shows the relationship among the potentials of the lines in the case where data written in the memory cells in the first to m-th rows is erased (data erasing in a plurality of rows at a time), in the case where data "1" is written to the memory cell in the k-th row and the first column and data "0" is written to the memory cells in the k-th row and the other columns (the second to n-th columns) (data writing in the k-th row), and in the case where data written in the memory cells in the k-th row are read out (data reading in the k-th row). When data are read out, data "1" is stored in the memory cell in the k-th row and the first column and data "0" is stored in the memory cells in the k-th row and the other columns (the second to n-th columns).

When data of a plurality of rows is erased at a time, S_1 to S_m are supplied with the potential V3 so that the transistors 162 in the first to m-th rows are turned on, and BL_1 to BL_n are supplied with GND so that the potentials of the nodes FG in the first to m-th rows are set to GND.

Note that the potential of G_1 is set to GND to turn off the selection transistors 180 and G_2 is supplied with the potential V1 to turn on the selection transistors 182. Alternatively, the selection line G_1 may be supplied with the potential V1.

When data writing is performed in the k-th row, S_1 to S_k are supplied with the potential V3 so that the transistors 162 in the first to k-th rows are turned on, and S_(k+1) to S_m are supplied with GND so that the transistors 162 in the (k+1)-th to m-th rows are turned off. BL_1 is supplied with the potential V2, and BL_2 to BL_n are supplied with GND.

Note that G_1 is supplied with GND so that the selection transistors 180 are turned off, and G_2 is supplied with the potential V1 so that the selection transistors 182 are turned on. WL_(k+1) to WL_m may be supplied with the potential V5.

As a result, the node FG in the memory cell in the k-th row and the first column is supplied with the potential V2. In other words, data "1" is written to the memory cell in the k-th row and the first column. Further, the nodes FG in the memory cells in the k-th row and the second to n-th columns are supplied with 0 V. In other words, data "0" is written to the memory cells in the k-th row and the second to n-th columns.

In such a manner, in the semiconductor device described in this embodiment, when data is written to the memory cells 190 in the k-th row (k is a natural number greater than or equal to 1 and smaller than or equal to m), the transistors 162 in the first to k-th rows need to be turned on; therefore, data is preferably written to the memory cell array sequentially from the m-th row.

When data reading is performed in the k-th row, S_1 to S_m are set at GND so that all the transistors 162 are turned off, and the selection line G_1 and the selection line G_2 are supplied with the potential V1 so that the selection transistors 180 and the selection transistors 182 are turned on. WL_k connected to the memory cells 190 in the k-th row from which data is to be read is set at GND, and WL_1 to WL_(k−1) and WL_(k+1) to WL_m connected to the memory cells 190 from which data is not to be read are supplied with the potential V5.

Note that in the case where a structure is employed in which the selection line G_1 and the selection transistors 180 are omitted or the selection line G_2 and the selection transistors 182 are omitted and only the selection line G corresponding to the selection line G_2 and the selection transistors 182 are provided as illustrated in FIG. 8, data writing, data holding, data reading, and data erasing in a plurality of rows at a time can also be performed basically in the same manner as the above operations.

Figure 10:
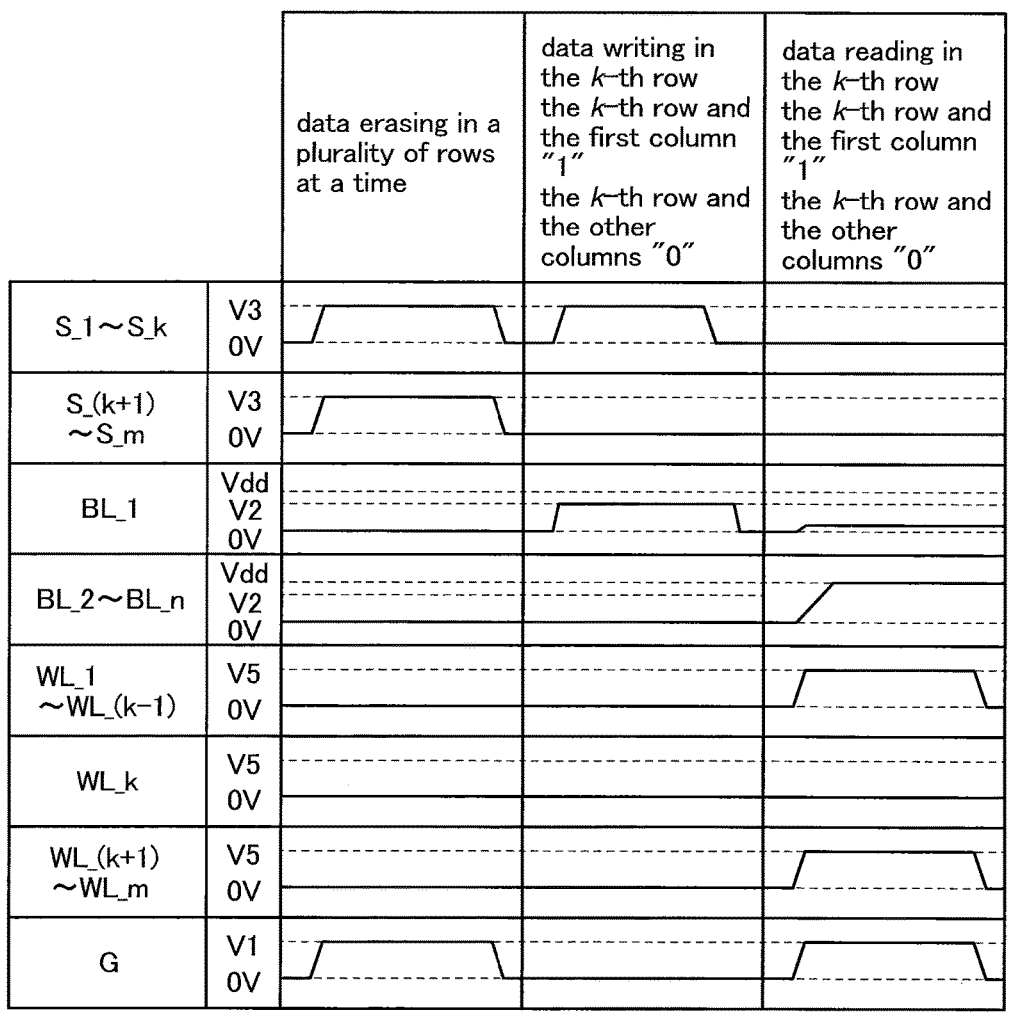
FIG. 10 illustrates a timing chart.

Note that as for the selection line G, the operation is slightly different from that in the semiconductor device in FIG. 7. Here, the potential of the selection line G in each operation is described with reference to FIG. 10 which is a timing chart for the detailed operations of the semiconductor device in FIG. 8. In the same manner as the timing chart in FIG. 9, the timing chart in FIG. 10 shows the relationship among the potentials of the lines in the case where data written in the memory cells in the first to m-th rows is erased (data erasing in a plurality of rows at a time), in the case where data "1" is written to the memory cell in the k-th row and the first column and data "0" is written to the memory cells in the k-th row and the other columns (the second to n-th columns) (data writing in the k-th row), and in the case where data written in the memory cells in the k-th row are read out (data reading in the k-th row). Thus, a difference between the timing chart in FIG. 10 and the timing chart in FIG. 9 is only the potential of the selection line G, and is described below.

When data of a plurality of rows is erased at a time, the selection line G is supplied with the potential V1 so that the selection transistors 182 are turned on. When data writing is performed in the k-th row, the potential of the selection line G is set to GND so that the selection transistors 182 are turned off. When data reading is performed in the k-th row, the selection line G is supplied with the potential V1 so that the selection transistors 182 are turned on. In the operations of the semiconductor device in FIG. 8, the selection line G is supplied with potentials in such a manner, whereby operations similar to the above operations in the timing chart in FIG. 9 can be performed.

Since the off-state current of the transistors including an oxide semiconductor in the semiconductor device described in this embodiment is extremely small, stored data can be held for an extremely long time owing to such transistors. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

A semiconductor device having a novel feature can be realized by being provided with both the transistor including a material other than an oxide semiconductor (in a broader sense, a transistor capable of operating at sufficiently high speed) and the transistor including an oxide semiconductor (in a broader sense, a transistor whose off-state current is sufficiently small).

In an embodiment in which side surfaces (or portions thereof) of components of a transistor are aligned with each other as in the semiconductor device described in this embodiment, a highly integrated semiconductor device can be realized. In particular, in a structure including three-dimensionally integrated transistors, a more significant effect can be obtained in combination with an increase in the degree of integration owing to this three-dimensional structure. Therefore, a highly integrated semiconductor device can be realized and the area occupied by the memory cells can be reduced. Accordingly, the storage capacity per unit area can be increased.

Note that the circuit configuration of a semiconductor device according to an embodiment of the disclosed invention is not limited to that illustrated in FIG. 7 or 8. For example, a circuit configuration may be employed in which the transistors 162 included in the memory cells 190 are connected in parallel with respect to wirings instead of being connected in series in the column direction, or in which the transistors 160 included in the memory cells 190 are connected in parallel with respect to wirings instead of being connected in series in the column direction.

The configurations, methods, and the like described in this embodiment can be combined as appropriate with any of the configurations, methods, and the like described in the other embodiments.

Embodiment 3

In this embodiment, the cases where the semiconductor device described in any of the above embodiments is applied to electronic devices will be described with reference to FIGS. 11A to 11F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 11A:
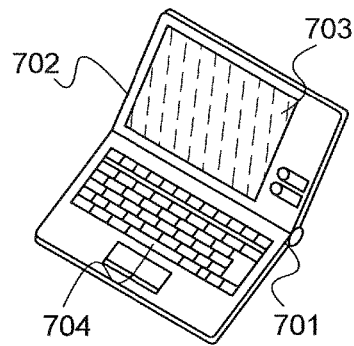
FIGS. 11A to 11F are diagrams each illustrating an electronic device including a semiconductor device.

FIG. 11A illustrates a notebook personal computer, which includes a housing 701, a housing 702, a display portion 703, a keyboard 704, and the like. The semiconductor device described in any of the above embodiments is provided in at least one of the housings 701 and 702. Thus, a notebook personal computer with sufficiently low power consumption, in which writing and reading of data can be performed at high speed and data can be stored for a long time, can be realized.

Figure 11D:
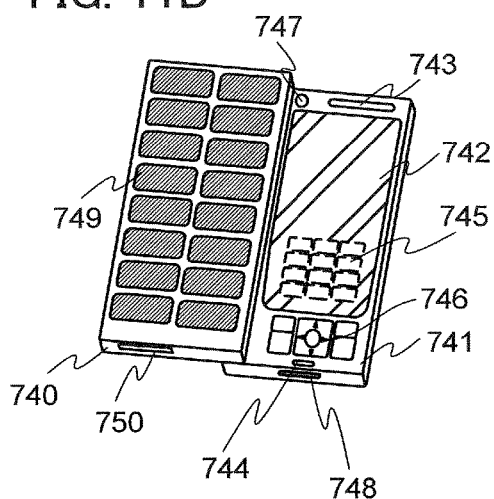
Figure 11B:
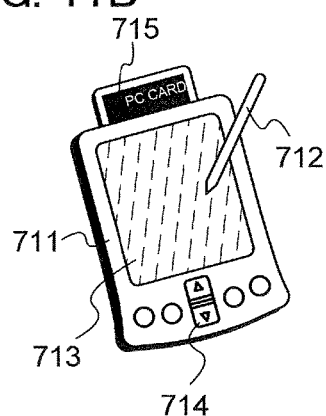

FIG. 11B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in any of the above embodiments is provided in the main body 711. Thus, a portable information terminal with sufficiently low power consumption, in which writing and reading of data can be performed at high speed and data can be stored for a long time, can be realized.

Figure 11E:
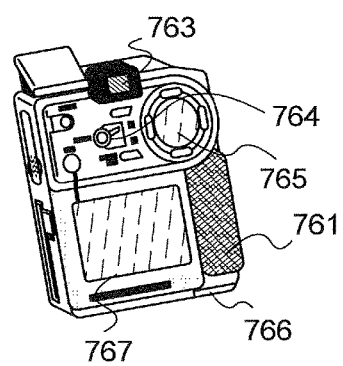
Figure 11C:
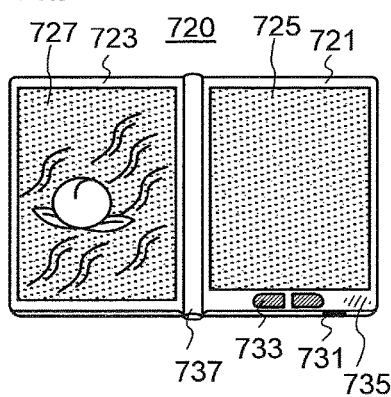

FIG. 11C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. At least one of the housings 721 and 723 is provided with the semiconductor device described in any of the above embodiments. Thus, an electronic book with sufficiently low power consumption, in which writing and reading of data can be performed at high speed and data can be stored for a long time, can be realized.

FIG. 11D illustrates a mobile phone set, which includes two housings, a housing 740 and a housing 741. Moreover, the housings 740 and 741 in a state where they are developed as illustrated in FIG. 11D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently low power consumption, in which writing and reading of data can be performed at high speed and data can be stored for a long time, can be realized.

FIG. 11E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently low power consumption, in which writing and reading of data can be performed at high speed and data can be stored for a long time, can be realized.

Figure 11F:
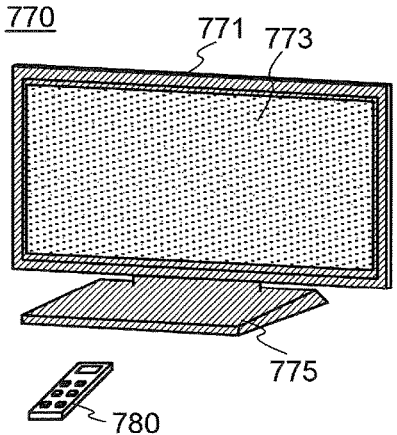

FIG. 11F is a television set 770, which includes a housing 771, a display portion 773, a stand 775, and the like. The television set 770 can be operated with a switch included in the housing 771 or with a remote controller 780. The semiconductor device described in any of the above embodiments is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

EXPLANATION OF REFERENCE

101: substrate, 103: insulating layer, 105: layer including conductive material, 107: insulating layer, 109: resist mask, 111: gate insulating layer, 113: layer including conductive material, 115: insulating layer, 117: insulating layer, 119: insulating layer, 121: element isolation insulating layer, 123: resist mask, 125: gate electrode, 127: region, 129: insulating layer, 130: impurity region, 131: insulating layer, 132: channel formation region, 133: oxide semiconductor layer, 135: oxide semiconductor layer, 137: conductive layer, 139: conductive layer, 141: oxide semiconductor layer, 143: source electrode, 145: drain electrode, 147: gate insulating layer, 149: gate electrode, 151: electrode, 155: region, 157: region, 160: transistor, 162: transistor, 164: capacitor, 180: selection transistor, 182: selection transistor, 190: memory cell, 701: housing, 702: housing, 703: display portion, 704: keyboard, 711: main body, 712: stylus, 713: display portion, 714: operation button, 715: external interface, 720: electronic book, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, and 780: remote controller.

This application is based on Japanese Patent Application serial no. 2010-129320 filed with Japan Patent Office on Jun. 4, 2010, the entire contents of which are hereby incorporated by reference.

The invention claimed is:

1. A semiconductor device comprising:
   a first transistor comprising:
      a source region and a drain region;
      a first channel formation region between the source region and the drain region;
      a first gate insulating layer over the first channel formation region; and
      a first gate electrode over the first gate insulating layer, the first gate electrode overlapping with the first channel formation region; and
   a second transistor comprising:
      a semiconductor layer comprising a second channel formation region;
      a source electrode and a drain electrode electrically connected to the second channel formation region, the source electrode and the drain electrode overlapping with a top surface of the semiconductor layer;
      a second gate electrode overlapping with the second channel formation region; and
      a second gate insulating layer between the second channel formation region and the second gate electrode,
   wherein the first gate electrode of the first transistor is electrically connected to one of the source electrode and the drain electrode of the second transistor,
   wherein the first channel formation region and the second channel formation region comprise different semiconductor materials as respective main components,
   wherein a side surface of the semiconductor layer and a side surface of the source electrode or the drain electrode are substantially aligned with each other, and
   wherein each of the side surface of the semiconductor layer and the side surface of the source electrode or the drain electrode is parallel with a channel length direction of the second transistor.

2. The semiconductor device according to claim 1, wherein a side surface of the first channel formation region, a side surface of the first gate insulating layer, and a side surface of the first gate electrode are substantially aligned with each other.

3. The semiconductor device according to claim 1, further comprising:
   an electrode over the second gate insulating layer, the electrode overlapping with the one of one of the source electrode and the drain electrode of the second transistor.

4. The semiconductor device according to claim 3, wherein the electrode overlaps with the first gate electrode.

5. The semiconductor device according to claim 1, wherein the semiconductor device is a memory device.

6. A semiconductor device comprising:
   a first transistor comprising:
      a source region and a drain region;
      a first channel formation region between the source region and the drain region;
      a first gate insulating layer over the first channel formation region; and
      a first gate electrode over the first gate insulating layer, the first gate electrode overlapping with the first channel formation region; and
   a second transistor comprising:
      a semiconductor layer comprising a second channel formation region;
      a source electrode and a drain electrode electrically connected to the second channel formation region, the source electrode and the drain electrode overlapping with a top surface of the semiconductor layer;
      a second gate electrode overlapping with the second channel formation region; and
      a second gate insulating layer between the second channel formation region and the second gate electrode,
   wherein the first gate electrode of the first transistor is electrically connected to one of the source electrode and the drain electrode of the second transistor,
   wherein the first channel formation region comprises silicon,
   wherein the second channel formation region comprises an oxide semiconductor,
   wherein a side surface of the semiconductor layer and a side surface of the source electrode or the drain electrode are substantially aligned with each other, and
   wherein each of the side surface of the semiconductor layer and the side surface of the source electrode or the drain electrode is parallel with a channel length direction of the second transistor.

7. The semiconductor device according to claim 6, wherein a side surface of the first channel formation region, a side surface of the first gate insulating layer, and a side surface of the first gate electrode are substantially aligned with each other.

8. The semiconductor device according to claim 6, further comprising:
   an electrode over the second gate insulating layer, the electrode overlapping with the one of one of the source electrode and the drain electrode of the second transistor.

9. The semiconductor device according to claim 8, wherein the electrode overlaps with the first gate electrode.

10. The semiconductor device according to claim 6, wherein the oxide semiconductor comprises at least one of indium, gallium, and zinc.

11. The semiconductor device according to claim 6, wherein the first channel formation region comprises single crystal silicon.

12. The semiconductor device according to claim 6, wherein the semiconductor device is a memory device.

13. A semiconductor device comprising:
   a substrate including a first channel formation region, a first source, and a first drain, wherein the substrate comprises silicon;
   a first insulating layer over the first channel formation region;
   a first gate over the first insulating layer, the first gate overlapping with the first channel formation region;
   a second insulating layer over the first insulating layer;

a semiconductor layer over the first gate and the second insulating layer, the semiconductor layer including a second channel formation region, wherein the semiconductor layer comprises an oxide semiconductor;

a second source and a second drain over the semiconductor layer, the first gate, and the second insulating layer, one of the second source and the second drain electrically connected to the first gate;

a third insulating layer over the semiconductor layer, the second source, and the second drain; and a second gate over the third insulating layer, the second gate overlapping with the semiconductor layer, wherein a side surface of the semiconductor layer and a side surface of the second source or the second drain are substantially aligned with each other, and wherein each of the side surface of the semiconductor layer and the side surface of the second source or the second drain is parallel with a channel length direction of the semiconductor layer.

14. The semiconductor device according to claim 13, wherein a side surface of the first channel formation region, a side surface of the first insulating layer, and a side surface of the first gate are substantially aligned with each other.

15. The semiconductor device according to claim 13, further comprising:
an electrode over the third insulating layer, the electrode overlapping with the one of one of the second source and the second drain.

16. The semiconductor device according to claim 15, wherein the electrode overlaps with the first gate.

17. The semiconductor device according to claim 13, wherein the oxide semiconductor comprises at least one of indium, gallium, and zinc.

18. The semiconductor device according to claim 13, wherein the first channel formation region comprises single crystal silicon.

19. The semiconductor device according to claim 13, wherein the semiconductor device is a memory device.

* * * * *